US011087832B1

(12) United States Patent
Gomes et al.

(10) Patent No.: US 11,087,832 B1
(45) Date of Patent: Aug. 10, 2021

(54) THREE-DIMENSIONAL NANORIBBON-BASED STATIC RANDOM-ACCESS MEMORY

(71) Applicant: Intel Corporation, Santa Clara, CA (US)

(72) Inventors: Wilfred Gomes, Portland, OR (US); Kinyip Phoa, Beaverton, OR (US); Mauro J. Kobrinsky, Portland, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/806,283

(22) Filed: Mar. 2, 2020

(51) Int. Cl.
*G11C 11/412* (2006.01)
*G11C 11/419* (2006.01)
*H01L 27/11* (2006.01)

(52) U.S. Cl.
CPC .......... *G11C 11/412* (2013.01); *G11C 11/419* (2013.01); *H01L 27/1104* (2013.01); *H01L 27/1116* (2013.01)

(58) Field of Classification Search
CPC . G11C 11/412; G11C 11/419; H01L 27/1116; H01L 27/1104
See application file for complete search history.

(56) References Cited

U.S. PATENT DOCUMENTS 7,092,288 B2 8/2006 Lojek
7,701,751 B2 4/2010 Kang et al.
7,804,702 B2 9/2010 Madan
(Continued)

FOREIGN PATENT DOCUMENTS

EP 3534401 A2 9/2019
WO 2018208719 A1 11/2018

OTHER PUBLICATIONS

S. Joshi, S. P. Mohanty, E. Kougianos and V. P. Yanambaka, "Graphene Nanoribbon Field Effect Transistor Based Ultra-Low Energy SRAM Design," 2016 IEEE International Symposium on Nanoelectronic and Information Systems (iNIS), Gwalior, 2016, pp. 76-79 (Year: 2016).*

(Continued)

*Primary Examiner* — Khamdan N. Alrobaie
(74) *Attorney, Agent, or Firm* — Patent Capital Group

(57) ABSTRACT

Described herein are IC devices that include semiconductor nanoribbons stacked over one another to realize high-density 3D SRAM. An example device includes an SRAM cell built based on a first nanoribbon, suitable for forming NMOS transistors, and a second nanoribbon, suitable for forming PMOS transistors. Both nanoribbons may extend substantially in the same plane above a support structure over which the memory device is provided. The SRAM cell includes transistors M1-M4, arranged to form two inverter structures. The first inverter structure includes transistor M1 in the first nanoribbon and transistor M2 in the second nanoribbon, while the second inverter structure includes transistor M3 in the first nanoribbon and transistor M4 in the second nanoribbon. The IC device may include multiple layers of nanoribbons, with one or more such SRAM cells in each layer, stacked upon one another above the support structure, thus realizing 3D SRAM.

20 Claims, 11 Drawing Sheets

(56) References Cited

U.S. PATENT DOCUMENTS

| | | | | |
|---|---|---|---|---|
| 8,178,862 | B2* | 5/2012 | Colinge | H01L 29/66795 257/9 |
| 2002/0036313 | A1 | 3/2002 | Yang et al. | |
| 2010/0295102 | A1 | 11/2010 | Sankin et al. | |
| 2015/0035568 | A1 | 2/2015 | Peng et al. | |
| 2015/0162336 | A1 | 6/2015 | Kim et al. | |
| 2016/0197069 | A1* | 7/2016 | Morrow | H01L 21/76897 257/393 |
| 2017/0287905 | A1* | 10/2017 | Morrow | H01L 27/0688 |
| 2018/0323199 | A1 | 11/2018 | Roberts et al. | |
| 2019/0103406 | A1 | 4/2019 | Tang et al. | |
| 2019/0287908 | A1* | 9/2019 | Dogiamis | H01L 23/5385 |
| 2019/0305135 | A1* | 10/2019 | Radosavljevic | H01L 21/02603 |
| 2020/0127142 | A1* | 4/2020 | Dewey | H01L 29/41791 |

OTHER PUBLICATIONS

Rabieefar, Fahimeh & Dideban, Daryoosh. (2019). Utilizing Graphene Nano-Ribbon Transistor in Data Converters: A Comparative Study. ECS Journal of Solid State Science and Technology. 8. M30-M37. (Year: 2019).*

D. G. Anil, Y. Bai and Y. Choi, "Performance evaluation of ternary computation in SRAM design using graphene nanoribbon field effect transistors," 2018 IEEE 8th Annual Computing and Communication Workshop and Conference (CCWC), Las Vegas, NV, 2018, pp. 382-388 (Year: 2018).*

Hsieh, E.R., et al., "A Novel Architecture to Build Ideal-linearity Neuromorphic Synapses on a Pure Logic FinFET Platform Featuring 2.5ns PGM-time and 1012 Endurance," 2019 Symposium on VLSI Technology Digest of Technical Papers; 2 pages.

Khasanvis, S., et al., "Low-Power Heterogeneous Graphene Nanoribbon-CMOS Multistate Volatile Memory Circuit," 17 pages.

Trombini, H., et al., "Unraveling structural and compositional information in 3D FinFET electronic devices," Nature.com/Scientific Reports; 7 pages (Aug. 12, 2019).

Xu, C., et al., "Modeling, Analysis, and Design of Graphene Nano-Ribbon Interconnects," IEEE Transaction on Electron Devices; vol. 56, No. 8; pp. 1567-1578 (Aug. 2009).

U.S. Appl. No. 16/669,599, filed Oct. 31, 2019, Wilfred Gomes.

EP Extended European Search Report issued in EP Application No. 20191821.6 dated Feb. 2, 2021; 9 pages.

EP Partial Search Report issued in European Application No. 20181563.6 dated Jan. 11, 2021; 13 pages.

Non Final Office Action of U.S. Appl. No. 16/669,599 dated Jan. 11, 2021, 9 pages.

Notice of Allowance in U.S. Appl. No. 16/724,691 dated Jan. 13, 2021, 9 pages.

* cited by examiner

US 11,087,832 B1

THREE-DIMENSIONAL NANORIBBON-BASED STATIC RANDOM-ACCESS MEMORY

BACKGROUND

Embedded memory is important to the performance of modern system-on-a-chip (SoC) technology. Low power and high density embedded memory is used in many different computer products and further improvements are always desirable.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Overview

Figure 1:
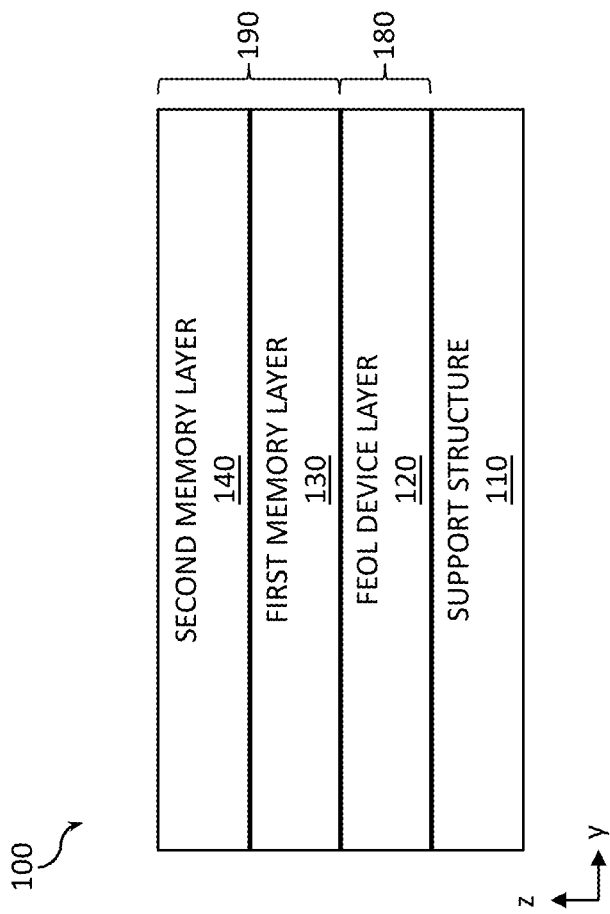
FIG. 1 provides a schematic illustration of an integrated circuit (IC) device with multiple layers of memory and logic that may include three-dimensional (3D) nanoribbon-based static random-access memory (SRAM), according to some embodiments of the present disclosure.

Some memory devices may be considered "standalone" devices in that they are included in a chip that does not also include compute logic (where, as used herein, the term "compute logic devices" or simply "compute logic" or "logic devices," refers to devices, e.g., transistors, for performing computing/processing operations). Other memory devices may be included in a chip along with compute logic and may be referred to as "embedded" memory devices. Using embedded memory to support compute logic may improve performance by bringing the memory and the compute logic closer together and eliminating interfaces that increase latency. Various embodiments of the present disclosure relate to embedded memory arrays, as well as corresponding methods and devices.

Some embodiments of the present disclosure may refer to SRAM and in particular, embedded SRAM (eSRAM). However, embodiments of the present disclosure may be equally applicable to memory cells implemented other technologies. Thus, in general, memory cells/arrays described herein may be implemented as stand-alone SRAM cells/arrays, eSRAM cells/arrays, non-volatile SRAM cells/arrays, or any other volatile or non-volatile memory cells/arrays.

An SRAM memory cell includes a plurality of transistors for storing a bit value or a memory state (e.g., logic "1" or "0") of the cell, and one or more access transistors for controlling access to the cell (e.g., access to write information to the cell or access to read information from the cell). A typical SRAM memory cell is made up of 6 transistors and is, therefore, may be referred to as a "6T SRAM memory cell," where 4 transistors are used to store a bit value and 2 transistors are access transistors, coupled to a bitline (BL) and a wordline (WL).

Various SRAM memory cells have, conventionally, been implemented with transistors being FEOL, logic-process based, transistors implemented in an upper-most layer of a semiconductor substrate. Inventors of the present disclosure realized that using conventional FEOL transistors creates several challenges for increasing memory density.

One challenge resides in that, given a usable surface area of a substrate, there are only so many FEOL transistors that can be formed in that area, placing a significant limitation on the density of memory cells incorporating such transistors. In conventional solutions, attempts to increase memory density have included decreasing the critical dimensions of the memory cells, which requires ever-increasing process complexity and cost, resulting in diminishing returns and expected slow pace of memory scaling for future nodes.

Embodiments of the present disclosure may improve on at least some of the challenges and issues described above by increasing the number of active memory layers, to generate a vertically-stacked SRAM design using fewer masks and at a lower cost. In particular, embodiments of the present disclosure are based on using semiconductor nanoribbons stacked above one another to realize high-density 3D SRAM. In the context of the present disclosure, the term "above" may refer to being further away from the support structure or the FEOL of an IC device, while the term "below" refers to being closer towards the support structure or the FEOL of the IC device. Furthermore, as used herein, the term "nanoribbon" refers to an elongated semiconductor structure having a long axis substantially parallel to a support structure (e.g., a substrate, a chip, or a wafer) over which a memory device is provided. In some settings, the term "nanoribbon" has been used to describe an elongated semiconductor structure that has a rectangular transverse cross-section (i.e., a cross-section in a plane perpendicular to the longitudinal axis of the structure), while the term "nanowire" has been used to describe a similar structure but with a circular transverse cross-section. In the present disclosure, the term "nanoribbon" is used to describe both such nanoribbons and such nanowires, as well as elongated semiconductor structures with a longitudinal axis parallel to the support structures and with having transverse cross-sections of any geometry (e.g., oval, or a polygon with rounded corners).

Described herein are IC devices that include semiconductor nanoribbons stacked over one another to realize high-density three-dimensional (3D) static random-access memory (SRAM). An example IC device includes an SRAM cell built based on a first nanoribbon of a first semiconductor material, suitable for forming N-type metal-oxide-semiconductor (NMOS) transistors, and a second nanoribbon of a second semiconductor material, suitable for forming P-type metal-oxide-semiconductor (PMOS) transistors. Both nanoribbons extend in a direction substantially parallel to a support structure (e.g., a substrate, a chip, or a wafer) over which the memory device is provided, and are substantially in the same plane above the support structure. The SRAM cell includes transistors M1-M4, which may be provided with independent gate control, arranged to form two inverter structures. The first inverter structure includes transistor M1 in the first nanoribbon (i.e., an NMOS transistor) and transistor M2 in the second nanoribbon (i.e., a PMOS transistor), and the second inverter structure includes transistor M3 in the first nanoribbon (i.e., an NMOS transistor) and transistor M4 in the second nanoribbon (i.e., a PMOS transistor). The SRAM cell may further include additional transistors, e.g., access transistors, arranged in one or more of the first nanoribbon, the second nanoribbon, and/or one or more additional nanoribbons. For example, in various embodiments, such a nanoribbon-based SRAM cell may be a 6T SRAM cell, an 8T SRAM cell, a 10T SRAM cell, or any other type of SRAM cells. The IC device may include multiple such SRAM cells, arranged in a single layer above the support structure, and multiple layers of nanoribbons with one or more SRAM cells in each layer, stacked upon one another above the support structure, thus realizing 3D SRAM.

Using nanoribbon-based transistors to implement 3D SRAM cells, e.g., using nanoribbon based transistors with independent gate control, may provide several advantages and enable unique architectures that were not possible with conventional, FEOL logic transistors. One advantage is that nanoribbon transistors may be moved to the back end of line (BEOL) layers of an advanced complementary metal oxide semiconductor (CMOS) process. Moving transistors of memory cells to the BEOL layers may ease the integration challenges introduced by the desire to embed memory arrays. Another advantage is that incorporating transistors of SRAM cells in different layers above the support structure may allow significantly increasing density of memory devices (e.g., density of memory cells in a memory array) having a given footprint area (the footprint area being defined as an area in a plane of the substrate, or a plane parallel to the plane of the substrate, i.e., the x-y plane of an example coordinate system shown in the drawings of the present disclosure), or, conversely, allows significantly reducing the footprint area of a structure with a given density of memory and/logic devices. Furthermore, by embedding at least some, but preferably all, of the SRAM transistors in the upper metal layers (i.e., in layers away from the support structure) according to at least some embodiments of the present disclosure, the peripheral circuits that control the memory operation can be hidden below the memory area to substantially reduce the memory macro array (i.e., the footprint area in the x-y plane of an example coordinate system shown in the drawings of the present disclosure). Still further, nanoribbon transistors may have improved performance compared to conventional FEOL transistors, or transistors of other architectures, and providing independent gate control to at least some of the transistors of different memory cells may advantageously improve control of the overall memory devices while preserving the substrate area and cost.

As the foregoing illustrates, stacked nanoribbon-based transistors as described herein may be used to address the scaling challenges of conventional (e.g., FEOL) memory technology and enable high density embedded memory compatible with an advanced CMOS process. Other technical effects will be evident from various embodiments described here.

In the following, some descriptions may refer to a particular S/D region or contact being either a source region/contact or a drain region/contact. However, unless specified otherwise, which region/contact of a transistor is considered to be a source region/contact and which region/contact is considered to be a drain region/contact is not important because, as is common in the field of FETs, designations of source and drain are often interchangeable. Therefore, descriptions of some illustrative embodiments of the source and drain regions/contacts provided herein are applicable to embodiments where the designation of source and drain regions/contacts may be reversed. Furthermore, although descriptions of the present disclosure may refer to logic devices or memory cells provided in a given layer, each layer of the IC devices described herein may also include other types of devices besides logic or memory devices described herein. For example, in some embodiments, IC devices with 3D nanoribbon-based SRAM cells may also include dynamic random-access memory (DRAM) memory cells, or any other type of memory cells, in any of the layers.

As used herein, the term "metal layer" may refer to a layer above a support structure that includes electrically conductive interconnect structures for providing electrical connectivity between different IC components. Metal layers described herein may also be referred to as "interconnect layers" to clearly indicate that these layers include electrically conductive interconnect structures which may but does not have to be metal.

The systems, methods and devices of this disclosure each have several innovative aspects, no single one of which is solely responsible for the all of the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art. For example, the term "connected" means a direct electrical or magnetic connection between the things that are connected, without any intermediary devices, while the term "coupled" means either a direct electrical or magnetic connection between the things that are connected, or an indirect connection through one or more passive or active intermediary devices. The term "circuit" means one or more passive and/or active components that are arranged to cooperate with one another to provide a desired function. As used herein, a "logic state" (or, alternatively, a "state" or a "bit" value) of a memory cell may refer to one of a finite number of states that the cell can have, e.g., logic states "1" and "0," each state represented by a different voltage of the capacitor of the cell, while "READ" and "WRITE" memory access or operations refer to, respectively, determining/sensing a logic state of a memory cell and programming/setting a logic state of a memory cell. If used, the terms "oxide," "carbide,"

"nitride," etc. refer to compounds containing, respectively, oxygen, carbon, nitrogen, etc., the term "high-k dielectric" refers to a material having a higher dielectric constant (k) than silicon oxide, while the term "low-k dielectric" refers to a material having a lower k than silicon oxide. The terms "substantially," "close," "approximately," "near," and "about," generally refer to being within +/−20% of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description may use the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense. For convenience, if a collection of drawings designated with different letters are present, e.g., FIGS. 4A-4B, such a collection may be referred to herein without the letters, e.g., as "FIG. 4."

In the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Various IC devices with 3D nanoribbon-based SRAM cells as described herein may be implemented in, or associated with, one or more components associated with an IC or/and may be implemented between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

Example Layering

FIG. 1 provides a schematic illustration of a cross-sectional view of an example IC device 100 with multiple layers of memory and logic that may include 3D nanoribbon-based SRAM, according to some embodiments of the present disclosure. As shown in FIG. 1, in general, the IC device 100 may include a support structure 110, a FEOL device layer 120, a first memory layer 130, and a second memory layer 140.

Implementations of the present disclosure may be formed or carried out on the support structure 110, which may be, e.g., a substrate, a die, a wafer or a chip. The support structure 110 may, e.g., be the wafer 2000 of FIG. 6A, discussed below, and may be, or be included in, a die, e.g., the singulated die 2002 of FIG. 6B, discussed below. The support structure 110 may be a semiconductor substrate composed of semiconductor material systems including, for example, N-type or P-type materials systems. In one implementation, the semiconductor substrate may be a crystalline substrate formed using a bulk silicon or a silicon-on-insulator (SOI) substructure. In other implementations, the semiconductor substrate may be formed using alternate materials, which may or may not be combined with silicon, that include, but are not limited to, germanium, silicon germanium, indium antimonide, lead telluride, indium arsenide, indium phosphide, gallium arsenide, aluminum gallium arsenide, aluminum arsenide, indium aluminum arsenide, aluminum indium antimonide, indium gallium arsenide, gallium nitride, indium gallium nitride, aluminum indium nitride or gallium antimonide, or other combinations of group III-V materials (i.e., materials from groups III and V of the periodic system of elements), group II-VI (i.e., materials from groups II and IV of the periodic system of elements), or group IV materials (i.e., materials from group IV of the periodic system of elements). In some embodiments, the substrate may be non-crystalline. In some embodiments, the support structure 110 may be a printed circuit board (PCB) substrate. Although a few examples of materials from which the substrate may be formed are described here, any material that may serve as a foundation upon which a semiconductor device implementing any of the 3D nanoribbon-based SRAM devices as described herein may be built falls within the spirit and scope of the present disclosure.

The first and second memory layers 130, 140 may, together, be seen as forming a memory array 190. As such, the memory array 190 may include various transistors of SRAM cells (e.g., the transistors M1-M6, described herein), capacitors, as well as WLs (e.g., row selectors) and BLs (e.g., column selectors), making up memory cells. On the other hand, the FEOL layer 120 may be a compute logic layer in that it may include various logic layers, circuits, and devices (e.g., logic transistors) to drive and control a logic IC. For example, the logic devices of the compute logic layer 120 may form a memory peripheral circuit 180 to control (e.g., access (read/write), store, refresh) the memory cells of the memory array 190.

In some embodiments, the FEOL layer 120 may be provided in a FEOL and in one or more lowest BEOL layers (i.e., in one or more BEOL layers which are closest to the support structure 110), while the first memory layer 130 and the second memory layer 140 may be seen as provided in respective BEOL layers. Various BEOL layers may be, or include, metal layers. Various metal layers of the BEOL may be used to interconnect the various inputs and outputs of the logic devices in the FEOL layer 120 and/or of the memory cells in the memory layers 130, 140. Generally speaking, each of the metal layers of the BEOL may include a via portion and a trench/interconnect portion. The trench portion of a metal layer is configured for transferring signals and power along electrically conductive (e.g., metal) lines (also sometimes referred to as "trenches") extending in the x-y plane (e.g., in the x or y directions), while the via portion of a metal layer is configured for transferring signals and power through electrically conductive vias extending in the z-direction, e.g., to any of the adjacent metal layers above or below. Accordingly, vias connect metal structures (e.g., metal lines or vias) from one metal layer to metal structures of an adjacent metal layer. While referred to as "metal" layers, various layers of the BEOL may include only certain patterns of conductive metals, e.g., copper (Cu), aluminum (Al), Tungsten (W), or Cobalt (Co), or metal alloys, or more generally, patterns of an electrically conductive material, formed in an insulating medium such as an interlayer dielectric (ILD). The insulating medium may include any suitable ILD materials such as silicon oxide, carbon-doped silicon oxide, silicon carbide, silicon nitride, aluminum oxide, and/or silicon oxynitride.

In other embodiments of the IC device 100, compute logic devices may be provided in a layer above the memory layers 130, 140, in between memory layers 130, 140, or combined with the memory layers 130, 140. Nanoribbon-based transistors with independent gate control as described herein may either be used as stand-alone transistors (e.g., the transistors of the FEOL 120) or included as a part of a memory cell (e.g., one or more transistors of the SRAM memory cells of the memory layers 130, 140), and may be included in various regions/locations in the IC device 100.

The illustration of FIG. 1 is intended to provide a general orientation and arrangement of various layers with respect to one another, and, unless specified otherwise in the present disclosure, includes embodiments of the IC device 100 where portions of elements described with respect to one of the layers shown in FIG. 1 may extend into one or more, or be present in, other layers. For example, power and signal interconnects for the various components of the IC device 100 may be present in any of the layers shown in FIG. 1, although not specifically illustrated in IG. 1. Furthermore, although two memory layers 130, 140 are shown in FIG. 1, in various embodiments, the IC device 100 may include any other number of one or more of such memory layers.

Example Nanoribbon-Based Transistor

As described above, various transistors of SRAM cells may be implemented as nanoribbon-based transistors (or, simply, nanoribbon transistors, e.g., nanowire transistors). In a nanoribbon transistor, a gate stack that may include a stack of one or more gate electrode metals and, optionally, a stack of one or more gate dielectrics may be provided around a portion of an elongated semiconductor structure called "nanoribbon", forming a gate on all sides of the nanoribbon. The portion of the nanoribbon around which the gate stack wraps around is referred to as a "channel" or a "channel portion." A semiconductor material of which the channel portion of the nanoribbon is formed is commonly referred to as a "channel material." A source region and a drain region are provided on the opposite ends of the nanoribbon, on either side of the gate stack, forming, respectively, a source and a drain of such a transistor. Wrap-around or all-around gate transistors, such as nanoribbon and nanowire transistors, may provide advantages compared to other transistors having a non-planar architecture, such as FinFETs.

Figure 2:
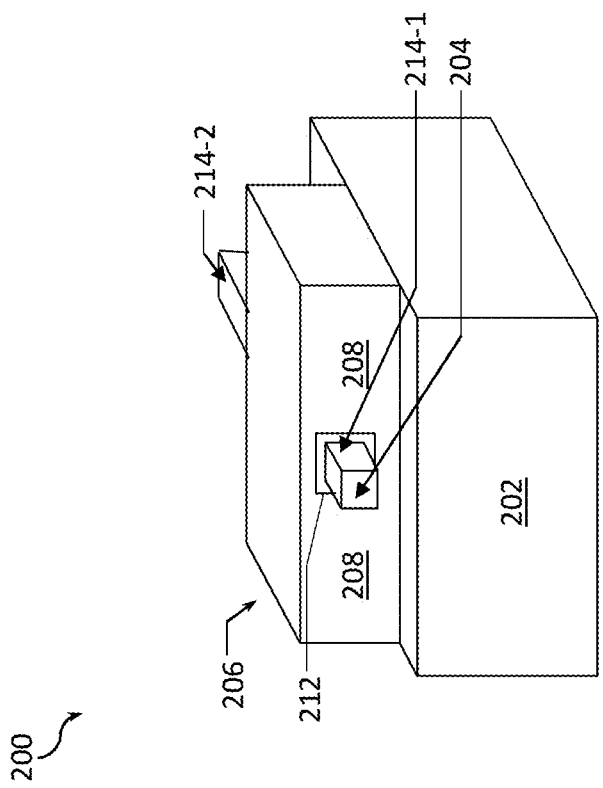
FIG. 2 provides a perspective view of an example nanoribbon-based field-effect transistor (FET), according to some embodiments of the present disclosure.

FIG. 2 provides a perspective view of an example nanoribbon-based FET 200, according to some embodiments of the present disclosure.

The arrangement shown in FIG. 2 (and other drawings of the present disclosure) is intended to show relative arrangements of some of the components therein, and the transistor 200, or portions thereof, may include other components that are not illustrated. For example, although not specifically illustrated in FIG. 2, a dielectric spacer may be provided between the source electrode and the gate stack as well as between the transistor S/D electrodes and the gate stack of the all-around-gate transistor 200 in order to provide electrical isolation between the source, gate, and drain electrodes. In another example, although not specifically illustrated in FIG. 2, at least portions of the transistor 200 may be surrounded in an insulator material, such as any suitable ILD material. In some embodiments, such an insulator material may be a high-k dielectric including elements such as hafnium, silicon, oxygen, titanium, tantalum, lanthanum, aluminum, zirconium, barium, strontium, yttrium, lead, scandium, niobium, and zinc. Examples of high-k materials that may be used for this purpose may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In other embodiments, the insulator material surrounding portions of the transistor 200 may be a low-k dielectric material. Some examples of low-k dielectric materials include, but are not limited to, silicon dioxide, carbon-doped oxide, silicon nitride, organic polymers such as perfluorocyclobutane or polytetrafluoroethylene, fused silica glass (FSG), and organosilicates such as silsesquioxane, siloxane, or organosilicate glass. Although a single transistor 200 is illustrated in FIG. 2, this is simply for ease of illustration, and, in other embodiments, any greater number of transistors 200 may be provided along a single nanoribbon 204 according to various embodiments of the present disclosure.

Turning to the details of FIG. 2, a nanoribbon 204 made of one or more semiconductor materials, provided over a base 202, may provide the foundation where the transistor 200 may be formed. The nanoribbon 204 may take the form of a nanowire or nanoribbon, for example. The transistor 200 may include a channel portion that is a portion of the nanoribbon 204 that is at least partially surrounded by a gate stack 206. In some embodiments, the base 202 may be the support structure 110, described above. In some embodiments, a layer of oxide material or any other dielectric material (not specifically shown in FIG. 2) may be provided between the base 202 and the gate stack 206.

It should be noted that, although FIG. 2, as well as other drawings of the present disclosure, depict embodiments in which the longitudinal axis of the nanoribbon 204 runs substantially parallel to a plane of the base 202, this need not be the case. In other embodiments of the transistor 200, the nanoribbon 204 may be oriented, e.g., "vertically" so as to be perpendicular to a plane of the base 202. Furthermore, although the nanoribbon 204 illustrated in FIG. 2 is shown as having a square cross-section, the nanoribbon 204 may instead have a cross-section that is rectangular but not square, a cross-section that is rounded at corners or otherwise irregularly shaped, and the gate stack 206 may conform to the shape of the nanoribbon 204.

In some embodiments, the channel portion of the nanoribbon 204 may be composed of semiconductor material systems including, for example, N-type or P-type materials systems. In some embodiments, the channel portion of the nanoribbon 204 may include a high mobility oxide semiconductor material, such as tin oxide, antimony oxide, indium oxide, indium tin oxide, titanium oxide, zinc oxide, indium zinc oxide, gallium oxide, titanium oxynitride, ruthenium oxide, or tungsten oxide. In some embodiments, the channel portion of the nanoribbon 204 may include a combination of semiconductor materials. In some embodiments, the channel portion of the nanoribbon 204 may include a monocrystalline semiconductor, such as silicon (Si) or germanium (Ge). In some embodiments, the channel portion of the nanoribbon 204 may include a compound semiconductor with a first sub-lattice of at least one element from group III of the periodic table (e.g., Al, Ga, In), and a second sub-lattice of at least one element of group V of the periodic table (e.g., P, As, Sb).

For some example N-type transistor embodiments (i.e., for the embodiments where the transistor 200 is an NMOS transistor), the channel portion of the nanoribbon 204 may advantageously include a III-V material having a high electron mobility, such as, but not limited to InGaAs, InP, InSb, and InAs. For some such embodiments, the channel portion of the nanoribbon 204 may be a ternary III-V alloy, such as InGaAs, GaAsSb, InAsP, or InPSb. For some $In_xGa_{1-x}As$ fin embodiments, In content (x) may be between 0.6 and 0.9, and may advantageously be at least 0.7 (e.g., $In_{0.7}Ga_{0.3}As$). In some embodiments with highest mobility, the channel portion of the nanoribbon 204 may be an intrinsic III-V material, i.e., a III-V semiconductor material not intentionally doped with any electrically active impurity. In alternate embodiments, a nominal impurity dopant level may be present within the channel portion of the nanoribbon 204, for example to further fine-tune a threshold voltage Vt of the transistor 200, to provide HALO pocket implants, etc. Even for impurity-doped embodiments however, impurity dopant level within the channel portion of the nanoribbon 204 may be relatively low, for example below $10^{15}$ dopant atoms per cubic centimeter ($cm^{-3}$), and advantageously below $10^{13}$ $cm^{-3}$.

For some example P-type transistor embodiments (i.e., for the embodiments where the transistor 200 is a PMOS transistor), the channel portion of the nanoribbon 204 may advantageously be a group IV material having a high hole mobility, such as, but not limited to Ge or a Ge-rich SiGe alloy. For some example embodiments, the channel portion of the nanoribbon 204 may have a Ge content between 0.6 and 0.9, and advantageously may be at least 0.7. In some embodiments with highest mobility, the channel portion of the nanoribbon 204 may be intrinsic III-V (or IV for P-type devices) material and not intentionally doped with any electrically active impurity. In alternate embodiments, one or more a nominal impurity dopant level may be present within the channel portion of the nanoribbon 204, for example to further set a threshold voltage (Vt), or to provide HALO pocket implants, etc. Even for impurity-doped embodiments however, impurity dopant level within the channel portion is relatively low, for example below $10^{15}$ $cm^{-3}$, and advantageously below $10^{13}$ $cm^{-3}$.

In some embodiments, the channel portion of the nanoribbon 204 may be a thin-film material, such as a high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, if the transistor formed in the nanoribbon is a thin-film transistor (TFT), the channel portion of the nanoribbon 204 may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphite, and black phosphorus, each of which may possibly be doped with one or more of gallium, indium, aluminum, fluorine, boron, phosphorus, arsenic, nitrogen, tantalum, tungsten, and magnesium, etc. In some embodiments, the channel portion of the nanoribbon 204 may have a thickness between about 5 and 75 nanometers, including all values and ranges therein. In some embodiments, a thin-film channel material may be deposited at relatively low temperatures, which allows depositing the channel material within the thermal budgets imposed on back end fabrication to avoid damaging other components, e.g., front end components such as the logic devices.

The gate stack 206 of the transistor 200 may include a gate electrode material 208 and, optionally, a gate dielectric material 212. In various embodiments, the gate stack 206 may wrap entirely (as shown in FIG. 2) or partially (e.g., almost entirely, not shown in FIG. 2) around a portion of the nanoribbon 204, with the active region of the channel portion of the transistor 200 corresponding to the portion of the nanoribbon 204 wrapped by the gate stack 206. In particular, the gate dielectric material 212 may wrap around a transversal portion of the nanoribbon 204 and the gate electrode material 208 may wrap around the gate dielectric material 212. In some embodiments, the gate stack 206 may fully encircle the nanoribbon 204, as shown in FIG. 2, thus realizing a so-called "all-around-gate" transistor. In use, the all-around-gate transistor 200 may form conducting channels on more than three "sides" of the nanoribbon 204, potentially improving performance relative to FinFETs. In some embodiments, regardless of the exact cross-sectional shape of the nanoribbon 204, the gate stack 206 may conform to the shape of the nanoribbon 204.

The gate electrode material 208 may include at least one P-type work function metal or N-type work function metal, depending on whether the transistor 200 is a PMOS transistor or an NMOS transistor. A P-type work function metal may be used as the gate electrode material 208 when the transistor 200 is a PMOS transistor and an N-type work function metal may be used as the gate electrode material 208 when the transistor 200 is an NMOS transistor. For a PMOS transistor 200, metals that may be used for the gate electrode material 208 may include, but are not limited to, ruthenium, palladium, platinum, cobalt, nickel, and conductive metal oxides (e.g., ruthenium oxide). For an NMOS transistor 200, metals that may be used for the gate electrode material 208 include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, the gate electrode material 208 may include a stack of two or more metal layers, where one or more metal layers are work function metal layers and at least one metal layer is a fill metal layer. Further layers may be included next to the gate electrode material 208 for other purposes, such as to act as a diffusion barrier layer or/and an adhesion layer.

In some embodiments, the gate dielectric material 212 may include one or more high-k dielectrics including any of the materials discussed herein with reference to the insulator material that may surround portions of the memory cell 200. In some embodiments, an annealing process may be carried out on the gate dielectric material 212 during manufacture of the transistor 200 to improve the quality of the gate dielectric material 212. The gate dielectric material 212 may have a thickness that may, in some embodiments, be between about 0.5 nanometers and 2 nanometers, including all values and ranges therein (e.g., between about 1 and 2 nanometers, or between about 1 and 1.5 nanometers). In some embodiments, the gate stack 206 may be surrounded by a gate spacer, not shown in FIG. 2. Such a gate spacer would be configured to provide separation between the gate stack 206 and source/drain contacts of the transistor 200 and could be made of a low-k dielectric material, some examples of which have been provided above. A gate spacer may include pores or air gaps to further reduce its dielectric constant.

As further shown in FIG. 2, the nanoribbon 204 may include a source region and a drain region on either side of the gate stack 206, thus realizing a transistor. As is well known in the art, source and drain regions are formed for the gate stack of each FET. As described above, under some operating conditions of a transistor, the source and drain regions of a transistor may be interchangeable, and, therefore, a nomenclature of a first S/D region and a second S/D region for the transistor 200 has been introduced for use in the present disclosure in order to not limit the descriptions to a particular designation of a source region and a drain region. In FIG. 2, reference numeral 214-1 is used to label the first S/D region and reference numeral 214-2 is used to label the second S/D region of the transistor 200.

The S/D regions 214 of the transistor 200 may generally be formed using either an implantation/diffusion process or an etching/deposition process. In the former process, dopants such as boron, aluminum, antimony, phosphorous, or arsenic may be ion-implanted into the nanoribbon 204 to form the source and drain regions 214. An annealing process that activates the dopants and causes them to diffuse further into the nanoribbon 204 may follow the ion implantation process. In the latter process, portions of the nanoribbon 204 may first be etched to form recesses at the locations of the future S/D regions 214. An epitaxial deposition process may then be carried out to fill the recesses with material that is used to fabricate the S/D regions 214. In some implementations, the S/D regions 214 may be fabricated using a silicon alloy such as silicon germanium or silicon carbide. In some implementations the epitaxially deposited silicon alloy may be doped in situ with dopants such as boron, arsenic, or phosphorous. In further embodiments, the S/D regions 214 may be formed using one or more alternate semiconductor materials such as germanium or a group III-V material or alloy. And in further embodiments, one or more layers of metal and/or metal alloys may be used to form the S/D regions 214.

In some embodiments, the transistor 200 may have a gate length (i.e., a distance between the first and second S/D regions 214), a dimension measured along the nanoribbon 204, between about 5 and 40 nanometers, including all values and ranges therein (e.g., between about 5 and 25 nanometers, or between about 10 and 20 nanometers). In some embodiments, an area of a transversal cross-section of the nanoribbon 204 may be between about 25 and 10000 square nanometers, including all values and ranges therein (e.g., between about 25 and 1000 square nanometers, or between about 25 and 500 nanometers).

Below, example arrangements in which a plurality of nanoribbon-based transistors 200 may be arranged to form a memory array are described.

Example Arrangements with 6T SRAM Cells

Figure 3:
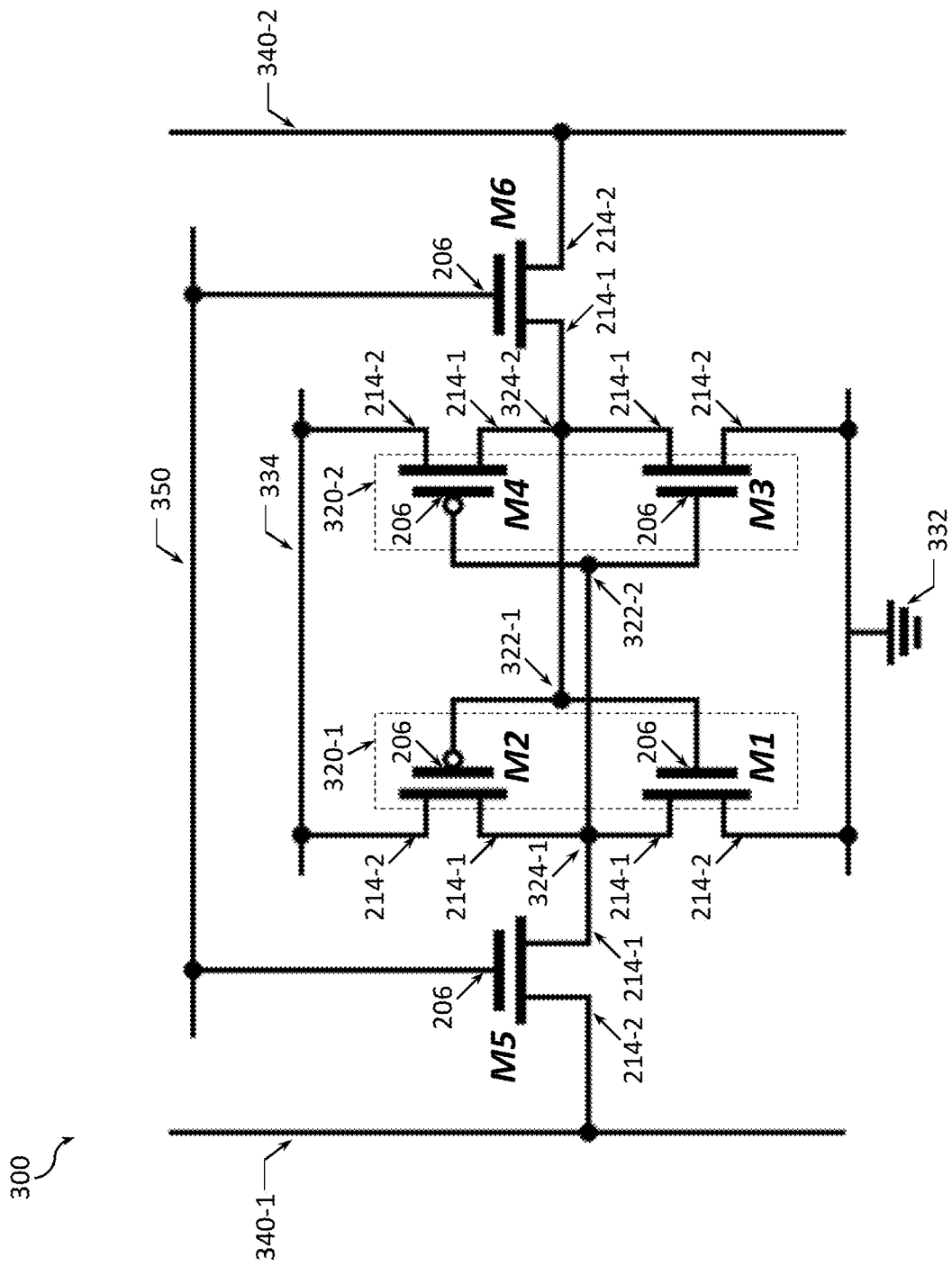
FIG. 3 provides an electric circuit diagram of an example 6-transistor (6T) SRAM cell, according to some embodiments of the present disclosure.

FIG. 3 provides an electric circuit diagram of an example 6T SRAM memory cell 300, according to some embodiments of the present disclosure. The SRAM cell 300 includes transistors M1-M4 for storing a bit value or a memory state (e.g., logic "1" or "0") of the cell, and two access transistors, M5 and M6, for controlling access to the cell (e.g., access to write information to the cell or access to read information from the cell 300). Each of the transistors M1-M6 may be a nanoribbon-based transistor, such as the transistor 200 shown in FIG. 2. To illustrate that, FIG. 3 labels the first and second S/D regions 214-1 and 214-2 and the gate stack 206 for each of the transistors M1-M6. However, in other embodiments of the SRAM cell 300, one or more of the transistors M1-M6 may be implemented in a geometry different from that of the transistor 200.

In the SRAM cell 300, each bit may be stored on four transistors (M1, M2, M3, M4) that form two cross-coupled inverters 320, each having an input 322 and an output 324. The first inverter 320-1 may be formed by an NMOS transistor M1 and a PMOS transistor M2, while the second inverter 320-2 may be formed by an NMOS transistor M3 and a PMOS transistor M4. As shown in FIG. 3, the gate stack 206 of the transistor M1 may be coupled to the gate stack 206 of the transistor M2, and both of these gate stacks may be coupled to the input 322-1 of the first inverter 320-1. On the other hand, the first S/D region 214-1 of the transistor M1 may be coupled to the first S/D region 214-1 of the transistor M2, and both of these first S/D regions 214-1 may be coupled to the output 324-1 of the first inverter 320-1. Similarly, for the second inverter 320-2, the gate stack 206 of the transistor M3 may be coupled to the gate stack 206 of the transistor M4, and both of these gate stacks may be coupled to the input 322-2 of the second inverter 320-2, while the first S/D region 214-1 of the transistor M3 may be coupled to the first S/D region 214-1 of the transistor M4, and both of these first S/D regions 214-1 may be coupled to the output 324-2 of the second inverter 320-2. As also shown in FIG. 3, when the transistors M1 and M3 are NMOS transistors and when the transistors M2 and M4 are PMOS transistors as illustrated in FIG. 3, the second S/D regions 214-2 of the transistors M1 and M3 may be coupled to a ground voltage 332, while the second S/D regions 214-2 of the transistors M2 and M4 may be coupled to a supply voltage 334, e.g., VDD. In the embodiments of the SRAM cell 300 where the NMOS transistors shown in FIG. 3 are replaced with PMOS transistors and vice versa, the designation of the ground voltage 332 and the supply voltage 334 would be reversed as well, all of which embodiments being within the scope of the present disclosure.

The four transistors M1-M4 in such configuration form a stable storage cell for storing a bit value of 0 or 1. As further shown in FIG. 3, two additional access transistors, M5 an M6, may serve to control the access to the storage cell of the transistors M1-M4 during read and write operations. As shown in FIG. 3, the first S/D region 214-1 of the access transistor M5 may be coupled to the output 324-1 of the first inverter 320-1. Phrased differently, the first S/D region 214-1 of the access transistor M5 may be coupled to each of the first S/D region 214-1 of the transistor M1 and the first S/D region 214-1 of the transistor M2. The second S/D region 214-2 of the access transistor M5 may be coupled to a first BL 340-1. Thus, each of the first S/D region 214-1 of the transistor M1 and the first S/D region 214-1 of the transistor M2 may be coupled to the first BL 340-1 (e.g., via the access transistor M5). The gate 206 of the access transistor M5 may be coupled to a WL 350. As further shown in FIG. 3, the first S/D region 214-1 of the access transistor M6 may be coupled to the output 324-2 of the second inverter 320-2. Phrased differently, the first S/D region 214-1 of the access transistor M6 may be coupled to each of the first S/D region 214-1 of the transistor M3 and the first S/D region 214-1 of the transistor M4. The second S/D region 214-2 of the access transistor M6 may be coupled to a second BL 340-2. Thus, each of the first S/D region 214-1 of the transistor M3 and the first S/D region 214-1 of the transistor M4 may be coupled to the second BL 340-1 (e.g., via the access transistor M6). The gate 206 of the access transistor M6 may be coupled to the WL 350. Thus, the gates 206 of both of the access transistors M5 and M6 may be coupled to a single, shared, WL, the WL 350. As also shown in FIG. 3, the input 322-1 of the first inverter 320-1 may be coupled to the first S/D region 214-1 of the access transistor M6, while the input 322-2 of the second inverter 320-2 may be coupled to the first S/D region 214-1 of the access transistor M5. In other words, each of the gate stack 206 of the transistor M1 and the gate stack 206 of the transistor M2 may be coupled to the first S/D region 214-1 of the access transistor M6, while each of the gate stack 206 of the transistor M3 and the gate stack 206 of the transistor M4 may be coupled to the first S/D region 214-1 of the access transistor M5. Phrased differently, each of the gate stack 206 of the transistor M1 and the gate stack 206 of the transistor M2 may be coupled to the second BL 340-2 (e.g., via the access transistor M6), while each of the gate stack 206 of the transistor M3 and the gate stack 206 of the transistor M4 may be coupled to the first BL 340-1 (e.g., via the access transistor M5).

The WL 350 and the first and second BLs 340 may be used together to read and program (i.e., write to) the SRAM cell 300. In particular, access to the cell may be enabled by the WL 350 which controls the two access transistors M5 and M6 which, in turn, control whether the cell 300 should be connected to the BLs 340-1 and 340-2. During operation of the SRAM cell 300, a signal on the first BL 340-1 may be complementary to a signal on the second BL 340-2. The two BLs 340 may be used to transfer data for both read and write operations. In other embodiments of the SRAM cell 300, only a single BL 340 may be used, instead of two bitlines 340-1 and 340-2, although having one signal BL and one inverse, such as the two BLs 340, may help improve noise margins.

During read accesses, the BLs 340 are actively driven high and low by the inverters 320 in the SRAM cell 300. This may improve SRAM bandwidth compared to DRAM. The symmetric structure of the SRAMs cell 300 also allows for differential signaling, which may provide an improvement in detecting small voltage swings. Another difference with DRAM that may contribute to making SRAM faster than DRAM is that commercial chips accept all address bits at a time. By comparison, commodity DRAMs may have the address multiplexed in two halves, i.e. higher bits followed by lower bits, over the same package pins in order to keep their size and cost down.

Each of the WL 350 and the BLs 340, as well as intermediate elements coupling these lines to various terminals described herein, may be formed of any suitable electrically conductive material, which may include an alloy or a stack of multiple electrically conductive materials. In some embodiments, such electrically conductive materials may include one or more metals or metal alloys, with metals such as ruthenium, palladium, platinum, cobalt, nickel, hafnium, zirconium, titanium, tantalum, and aluminum. In some embodiments, such electrically conductive materials may include one or more electrically conductive alloys oxides or carbides of one or more metals.

Figure 4A:
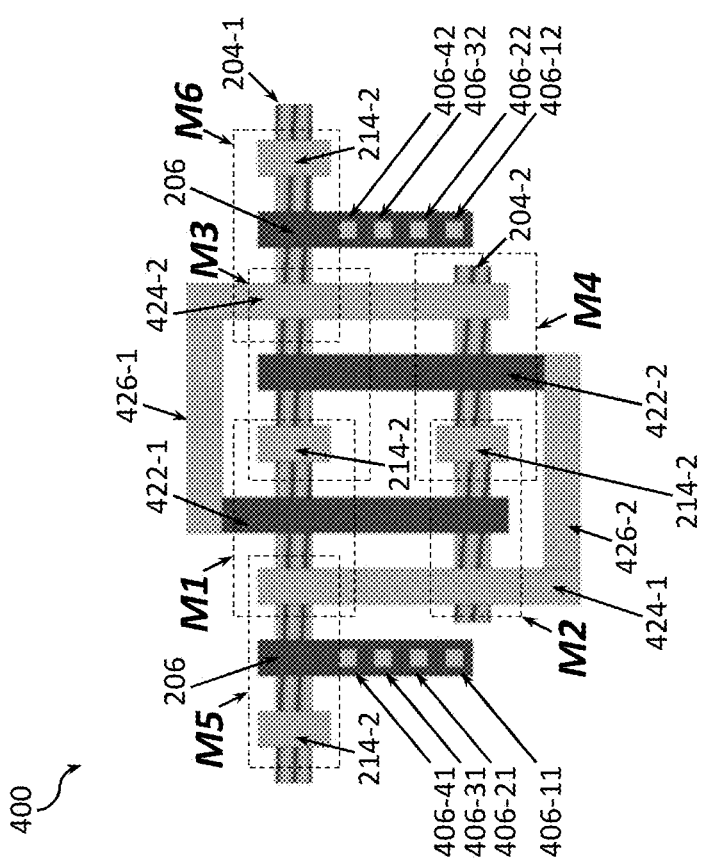
FIGS. 4A and 4B provide, respectively, top-down and perspective views of an example 3D nanoribbon-based SRAM device with a plurality of 6T SRAM cells, according to some embodiments of the present disclosure.
Figure 4B:
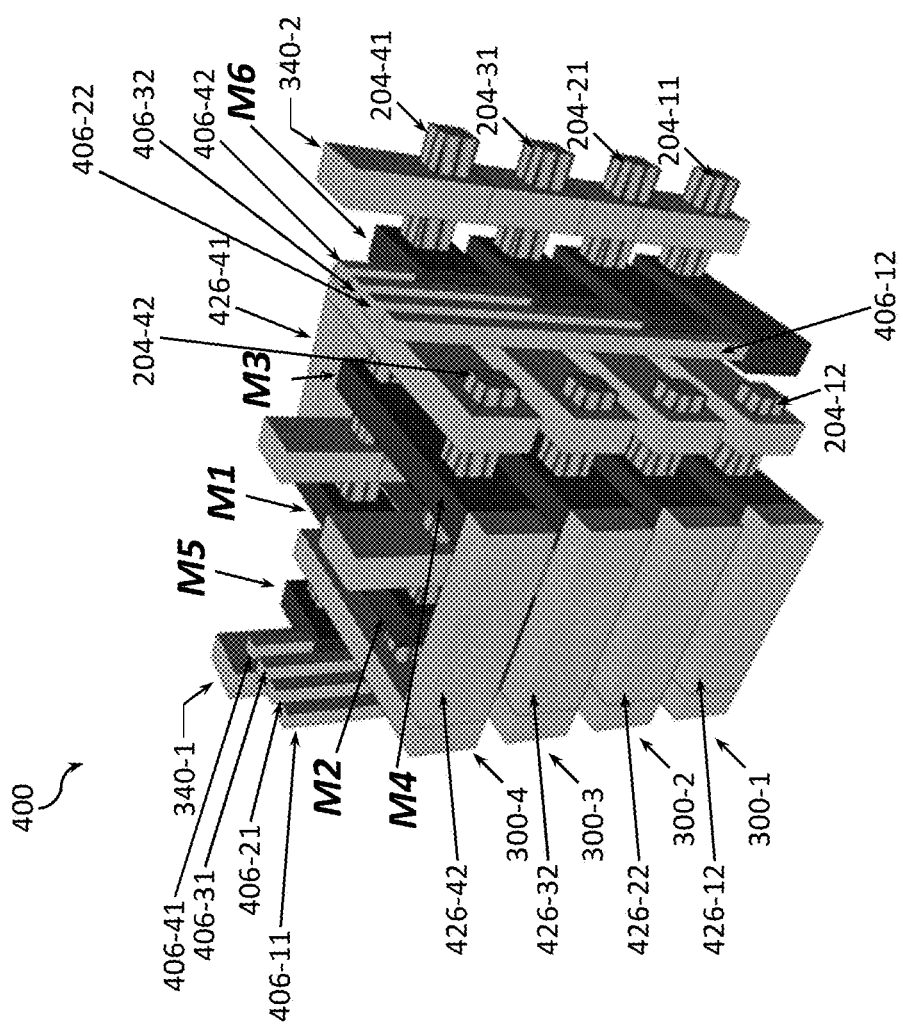

According to various embodiments of the present disclosure, the transistors M1, M3, M5, and M6 may be implemented along a single first nanoribbon, while the transistors M2 and M4 may be implemented along a single second nanoribbon. The first nanoribbon may be formed of a semiconductor material (which may include a combination of materials) suitable for forming transistors of a first type, e.g., NMOS transistors, while the second nanoribbon may be formed of a semiconductor material (which may include a combination of materials) suitable for forming transistors of a second type, e.g., PMOS transistors. FIGS. 4A and 4B provide different views of an IC device 400 with one example arrangement of a plurality of the SRAM cells 300 implemented using nanoribbon-based transistors 200 to form a 3D SRAM device.

FIGS. 4A and 4B provide, respectively, top-down and perspective views of an example 3D nanoribbon-based SRAM device 400, according to some embodiments of the present disclosure. The device 400 may be an example of the IC device 100, shown in FIG. 1, or may be an example of the memory array 190 of the IC device 100, having multiple memory layers. In particular, each memory layer of the device 400 implements the 6T SRAM cell 300 of FIG. 3. Two different views are shown in FIGS. 4A-4B in an attempt to bring clarity of the arrangement of the device 400, where different elements may be labeled in different views. It should be noted that not all elements shown in FIGS. 4A-4B are labeled with reference numerals in order to not clutter the drawings. For example, while the transistors M1-M6 are labeled in FIG. 4A (with the approximate boundaries of the individual transistors shown in FIG. 4A with dashed rectangles), only some of their gate stacks 206, and S/D regions 214-1, 214-2 are labeled with reference numerals and others are not labeled. In another example, while the first and second nanoribbons of the SRAM cell 300-1 of the first memory layer are labeled in FIG. 4B as a first nanoribbon 204-11 and a second nanoribbon 204-12, and while the first and second nanoribbons of the SRAM cell 300-4 of the fourth memory layer are labeled in FIG. 4B as a first nanoribbon 204-41 and a second nanoribbon 204-42, for the SRAM cells 300-2 and 300-3 (i.e., the SRAM cells 300 of the second and third memory layers, respectively) shown in FIG. 4B only the first nanoribbons are labeled, as nanoribbons 204-21 and 204-31, respectively.

As shown in FIG. 4B, the device 400 illustrates an example with four different memory layers, each showing one SRAM cell 300, labeled as an SRAM cell 300-1 for the first memory layer, an SRAM cell 300-2 for the second memory layer, an SRAM cell 300-3 for the third memory layer, and an SRAM cell 300-4 for the fourth memory layer. For example, the SRAM cell 300-1 may be the one closest to the base 202 (e.g., to the support structure 110), while the SRAM cell 300-4 may be the one farthest away from the base 202 (e.g., from the support structure 110). For example, the SRAM cell 300-1 may be implemented in the first memory layer 130 of the IC device 100 shown in FIG. 1, the SRAM cell 300-2 may be implemented in the second memory layer 140 of the IC device 100 shown in FIG. 1, and the SRAM cells 300-3 and 300-4 may be implemented in further memory layers which are not specifically shown in the IC device 100 shown in FIG. 1. Of course, while the device 400 illustrates an example of four memory layers, in other embodiments, the device 400 may include any other number of two or more such layers. Furthermore, while the device 400 illustrates only a single SRAM cell in each memory layers, in other embodiments, each memory layer of the device 400 may include any other number of one or more of such SRAM cells.

Because FIG. 4B illustrates multiple layers, the notation of reference numerals shown in FIG. 4B with double digits after the dash sign is supposed to indicate the memory layer with the first digit, and the reference numeral of a particular element of the layer with a second digit. For example, the reference numeral "204-11" is supposed to indicate the first nanoribbon 204-1 of the first memory layer (e.g., of the SRAM cell 300-1), while the reference numeral "204-12" is supposed to indicate the second nanoribbon 204-2 of the first memory layer (e.g., of the SRAM cell 300-1). In another example, the reference numeral "204-41" is supposed to indicate the first nanoribbon 204-1 of the fourth memory layer (e.g., of the SRAM cell 300-4), while the reference numeral "204-42" is supposed to indicate the second nanoribbon 204-2 of the fourth memory layer (e.g., of the SRAM cell 300-4). Because FIG. 4A illustrates a top-down planar view of a single memory layer, the notation of reference numerals shown in FIG. 4A is the same as in FIG. 4B except that the digits indicating a particular layer in FIG. 4B are omitted in FIG. 4A. For example, the reference numeral "204-1" of FIG. 4A is supposed to indicate the first nanoribbon of a given memory layer (which would be shown in FIG. 4B as the first nanoribbon 204-11 for the first memory layer, the first nanoribbon 204-21 for the second memory layer, and so on), while the reference numeral "204-2" of FIG. 4A is supposed to indicate the second nanoribbon of a given memory layer (which would be shown in FIG. 4B as the second nanoribbon 204-21 for the first memory layer, the first nanoribbon 204-41 for the fourth memory layer, and so on).

Again, in order to not clutter the drawings, the gate stacks 206 and the S/D regions 214-1, 214-2 of the individual transistors M1-M6 are not labeled in FIG. 4B and only the second S/D regions 214-2 are labeled in FIG. 4A. However, in each SRAM cell of the memory layers of the device 400, the gate stacks 206 and the S/D regions 214-1, 214-2 of the individual transistors M1-M6 of a given SRAM cell are coupled as described with reference to FIG. 3. In the interests of brevity, these descriptions are not repeated here. The descriptions provided herein make clear where each of the gate stacks 206 and the S/D regions 214-1, 214-2 of the individual transistors M1-M6 are in FIGS. 4A-4B.

The device 400 further illustrates that an SRAM cell 300 of a given layer may be implemented as, e.g., can be clearly seen from the top-down view of FIG. 4A. FIG. 4A illustrates that transistors M1, M3, M5, and M6 may be provided along a first nanoribbon 204-1 (the reference numeral "204-1" indicating that this nanoribbon could be a first instance of the nanoribbon 204 as described above), while transistors M2 and M4 may be provided along a second nanoribbon 204-2 (the reference numeral "204-2" indicating that this nanoribbon could be a second instance of the nanoribbon 204 as described above). The first nanoribbon 204-1 may be formed of a semiconductor material (which may include a combination of materials) suitable for forming transistors of a first type, e.g., NMOS transistors, while the second nanoribbon 204-2 may be formed of a semiconductor material (which may include a combination of materials) suitable for forming transistors of a second type, e.g., PMOS transistors, thus realizing NMOS transistors M1, M3, M5, and M6, and PMOS transistors M2 and M4, as shown in FIG. 3.

As shown in FIG. 4A, a shared gate stack 422-1 may be used to realize the gate stack 206 of the transistor M1 (the transistor M1 implemented based on the first nanoribbon 204-1) coupled to the gate stack 206 of the transistor M2 (the transistor M2 implemented based on the second nanoribbon 204-2), as was described with reference to FIG. 3. Thus, the shared gate stack 422-1 may represent a node that is the input 322-1 of the first inverter 320-1 of the SRAM cell 300. Similarly, a shared gate stack 422-2 may be used to realize the gate stack 206 of the transistor M3 (the transistor M3 implemented based on the first nanoribbon 204-1) coupled to the gate stack 206 of the transistor M4 (the transistor M4 implemented based on the second nanoribbon 204-2), as was described with reference to FIG. 3. Thus, the shared gate stack 422-2 may represent a node that is the input 322-2 of the second inverter 320-2 of the SRAM cell 300.

As also shown in FIG. 4A, a shared interconnect 424-1 may be used to realize the first S/D region 214-1 of the transistor M1 (the transistor M1 implemented based on the first nanoribbon 204-1) coupled to the first S/D region 214-1 of the transistor M2 (the transistor M2 implemented based on the second nanoribbon 204-2), as was described with reference to FIG. 3. Thus, the shared interconnect 424-1 may represent a node that is the output 324-1 of the first inverter 320-1 of the SRAM cell 300. Similarly, a shared interconnect 424-2 may be used to realize the first S/D region 214-1 of the transistor M3 (the transistor M3 implemented based on the first nanoribbon 204-1) coupled to the first S/D region 214-1 of the transistor M4 (the transistor M4 implemented based on the second nanoribbon 204-2), as was described with reference to FIG. 3. Thus, the shared interconnect 424-2 may represent a node that is the output 322-2 of the second inverter 320-2 of the SRAM cell 300.

A first interconnect 426-1, shown in FIG. 4A, may then be used to couple the shared gate stack 422-1 of the first inverter 320-1 to the shared interconnect 424-2 of the second inverter 320-2, thus realizing the coupling of the input 322-1 of the first inverter 320-1 to the output 324-2 of the second inverter 320-2, shown in FIG. 3. Similarly, a second interconnect 426-2, shown in FIG. 4A, may then be used to couple the shared gate stack 422-2 of the second inverter 320-2 to the shared interconnect 424-1 of the first inverter 320-1, thus realizing the coupling of the input 322-2 of the second inverter 320-2 to the output 324-1 of the first inverter 320-1, shown in FIG. 3.

FIG. 4A further illustrates that, in a given SRAM cell 300, the second S/D region 214-2 of the transistor M1 may be shared with (e.g., be the same as) the second S/D region 214-2 of the transistor M3 (since both of these transistors are implemented in a single nanoribbon in the device 400, namely, in the first nanoribbon 204-1). Both of the second S/D region 214-2 of the transistor M1 and the second S/D region 214-2 of the transistor M3 may be coupled to the ground potential 332, as was described with reference to FIG. 3. FIG. 4A also illustrates that, in a given SRAM cell 300, the second S/D region 214-2 of the transistor M2 may be shared with (e.g., be the same as) the second S/D region 214-2 of the transistor M4 (since both of these transistors are implemented in a single nanoribbon in the device 400, namely, in the second nanoribbon 204-2). Both of the second S/D region 214-2 of the transistor M2 and the second S/D region 214-2 of the transistor M4 may be coupled to the supply voltage 334, as was described with reference to FIG. 3.

In the device 400, some transistors may have gates controlled at the same time with the gates of other transistors while other transistors have gates which are controlled individually. For example, the gates of the transistors M1 and M2 may be controlled at the same time because these gates are coupled together by the shared gate stack 422-1, and the gates of the transistors M3 and M4 may be controlled at the same time because these gates are coupled together by the shared gate stack 422-2. On the other hand, the gates of the access transistors M5 and M6 may be controlled individually, thereby providing individual connections of these gates to the WL 350 in order to select a given SRAM cell for read/write operations. FIGS. 4A and 4B illustrate that, in some embodiments, gate contacts to the gate stacks 206 of the access transistors M5 in different layers of the memory array may be formed in a stair-case manner, and that, similarly, gate contacts to the gate stacks 206 of the access transistors M6 in different layers of the memory array may be formed in a stair-case manner. For example, FIG. 4B uses reference numerals 406-11, 406-21, 406-31, and 406-41 for the gate contacts to the gate stacks 206 of the access transistors M5 in, respectively, the SRAM cell 300-1 of the first memory layer of the memory array, the SRAM cell 300-2 of the second memory layer of the memory array, the SRAM cell 300-3 of the third memory layer of the memory array, and the SRAM cell 300-4 of the fourth memory layer of the memory array. The gate contact 406-11 may be used to couple the gate stack 206 of the access transistor M5 of the SRAM 300-1 to the WL 350 for the SRAM 300-1, the gate contact 406-21 may be used to couple the gate stack 206 of the access transistor M5 of the SRAM 300-2 to the WL 350 for the SRAM 300-2, the gate contact 406-31 may be used to couple the gate stack 206 of the access transistor M5 of the SRAM 300-3 to the WL 350 for the SRAM 300-3, and the gate contact 406-41 may be used to couple the gate stack 206 of the access transistor M5 of the SRAM 300-4 to the WL 350 for the SRAM 300-4. Similarly, FIG. 4B uses reference numerals 406-12, 406-22, 406-32, and 406-42 for the gate contacts to the gate stacks 206 of the access transistors M6 in, respectively, the SRAM cell 300-1 of the first memory layer of the memory array, the SRAM cell 300-2 of the second memory layer of the memory array, the SRAM cell 300-3 of the third memory layer of the memory array, and the SRAM cell 300-4 of the fourth memory layer of the memory array. The gate contact 406-12 may be used to couple the gate stack 206 of the access transistor M6 of the SRAM 300-1 to the WL 350 for the SRAM 300-1, the gate contact 406-22 may be used to couple the gate stack 206 of the access transistor M6 of the SRAM 300-2 to the WL 350 for the SRAM 300-2, the gate contact 406-32 may be used to couple the gate stack 206 of the access transistor M6 of the SRAM 300-3 to the WL 350 for the SRAM 300-3, and the gate contact 406-42 may be used to couple the gate stack 206 of the access transistor M6 of the SRAM 300-4 to the WL 350 for the SRAM 300-4. FIG. 4A also illustrates these reference numerals, as an exception (because otherwise FIG. 4A only illustrates reference numerals for the elements/components of a single memory layer), by pointing to the light squares coupled to the dark rectangle illustrating the gate stack of the transistors M5 and M6.

In some embodiments, the first and second nanoribbons 204-1, 204-2 of various memory layers may be in the planes substantially parallel to the plane of the base 202 or the support structure 110. In such embodiments, some electrically conductive structures of a given memory layer may also be in the same plane as the first and second nanoribbons 204-1, 204-2, e.g., the shared gate stacks 422-1 and 422-2, the shared interconnects 424-1 an 424-2, the first interconnect 426-1, and the second interconnect 426-2, as shown in FIG. 4B. However, other electrically conductive structures may extend in a direction substantially perpendicular to the plane of the base 202 or the support structure 110, e.g., the gate contacts 406-1 and 406-2, the BLs 340-1 and 340-2, contacts to the second S/D regions 214-2 of the transistors M1 in different memory layers, contacts to the second S/D regions 214-2 of the transistors M2 in different memory layers, contacts to the second S/D regions 214-2 of the transistors M3 in different memory layers, and contacts to the second S/D regions 214-2 of the transistors M4 in different memory layers. In some embodiments, some of the electrically conductive structures that extend in a direction substantially perpendicular to the plane of the base 202 or the support structure 110 may be electrically continuous structures, i.e., shared, among analogous components of different memory layers. For example, the contacts to the second S/D regions 214-2 of the transistors M1 in different memory layers may be implemented as a shared electrically conductive structure that is coupled to the ground potential 322. Such a shared electrically conductive structure may also be coupled to the contacts to the second S/D regions 214-2 of the transistors M3 in different memory layers (because the second S/D regions 214-2 of the transistors M1 and M3 may be shared, as can be seen in FIG. 4A). In another example, the contacts to the second S/D regions 214-2 of the transistors M2 in different memory layers may be implemented as a shared electrically conductive structure that is coupled to the supply voltage 324. Such a shared electrically conductive structure may also be coupled to the contacts to the second S/D regions 214-2 of the transistors M4 in different memory layers (because the second S/D regions 214-2 of the transistors M2 and M4 may be shared, as can be seen in FIG. 4A). In yet another example, the first BL 340-1, providing a contact to the second the second S/D regions 214-2 of the access transistors M5 in different memory layers may be implemented as a shared single electrically conductive structure. Similarly, the second BL 340-2, providing a contact to the second the second S/D regions 214-2 of the access transistors M6 in different memory layers may be implemented as a shared single electrically conductive structure. Thus, in some embodiments of the device 400, some of the BLs to the memory cells of different layers (e.g., the first BLs 340-1, or the second BLs 340-2) can be shorted (i.e., electrically coupled to one another, or be a shared BL) and the WLs to the memory cells of different layers can be created in a staircase fashion. Such a vertical topology can advantageously create a relatively small bitline capacitance and, therefore, the storage nodes of the individual memory cells can be very small, which may advantageously enable integration of larger number of SRAM cells. With such an approach, a large number of vertical memory cells may be fabricated at relatively low cost.

Example Arrangements with 8T SRAM Cells

The 6T SRAM cell as described herein provides a basic structure that may be used to implement 3D SRAM arrays. In other embodiments, additional transistors may be used in a given SRAM cell, e.g., in an 8T SRAM cell, a 10T SRAM cell, etc. In some embodiments, such additional transistors may be provided over and above the six transistors of the 6T SRAM cell as described above. One example of such embodiments is shown for the 8T SRAM device 500 illustrated in FIGS. 5A-5B. However, embodiments where 3D SRAM devices are built according to principles described herein with any number of additional transistors per SRAM cell besides the 6T SRAM cell configurations described herein are within the scope of the present disclosure.

Figure 5A:
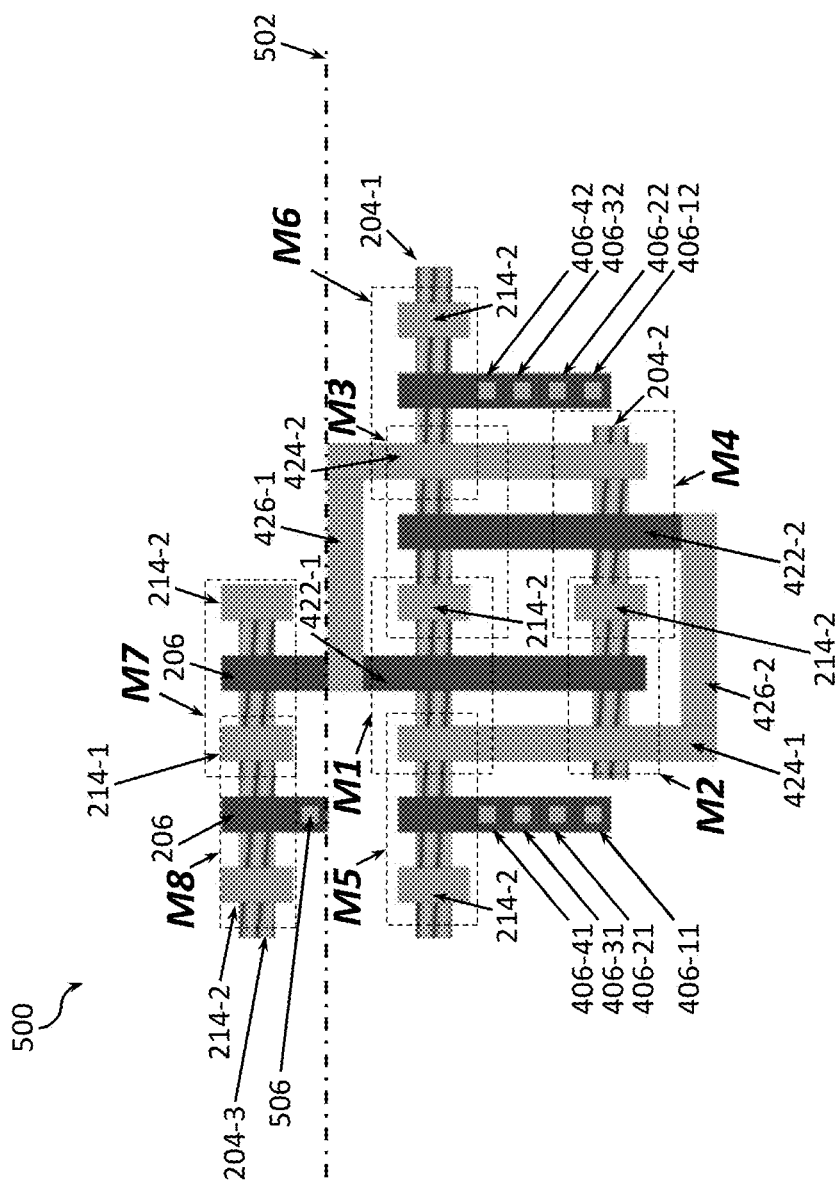
FIGS. 5A and 5B provide, respectively, top-down and perspective views of an example 3D nanoribbon-based SRAM device with a plurality of 8-transistor (8T) SRAM cells, according to some embodiments of the present disclosure.
Figure 5B:
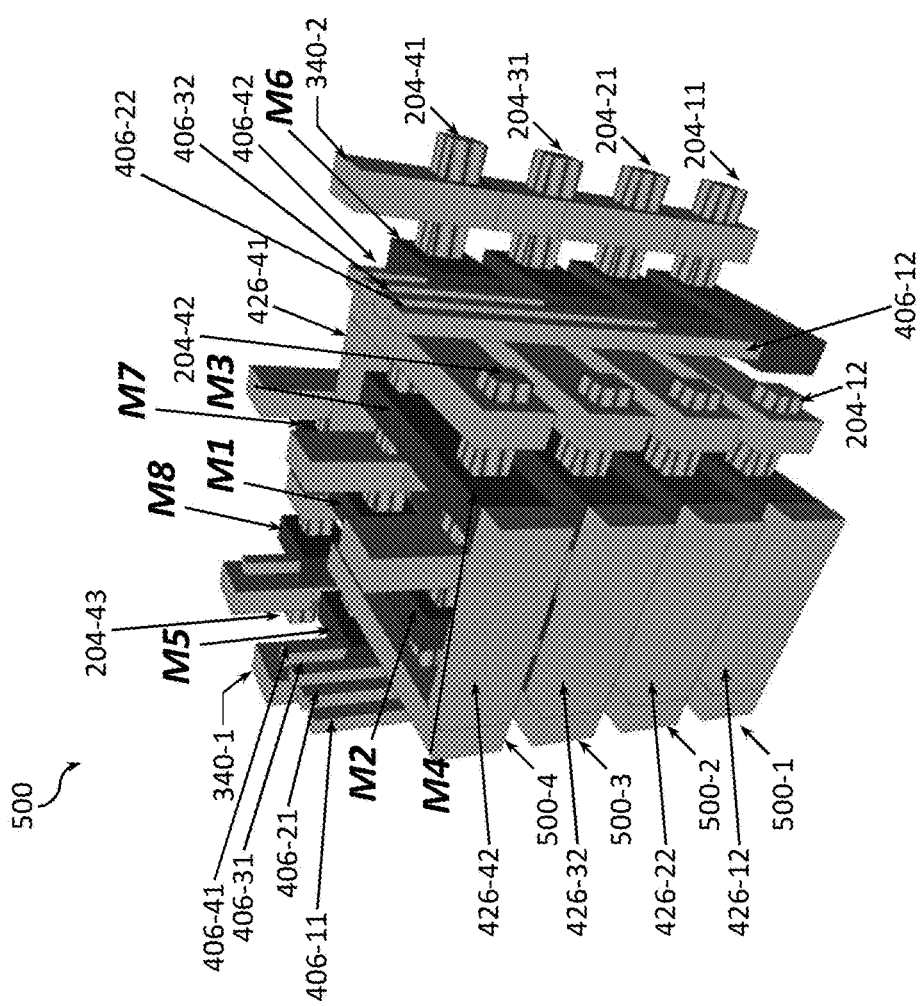

FIGS. 5A and 5B provide, respectively, top-down and perspective views of an example 3D nanoribbon-based SRAM device 500 with a plurality of 8T SRAM cells, according to some embodiments of the present disclosure. The illustrations of FIGS. 5A and 5B are similar to the illustrations of, respectively, FIGS. 4A and 4B, where all reference numerals (except for the reference numerals 300-1 through 300-4), as well as notations of the transistors M1-M6, used in FIGS. 4A-4B are also shown in FIGS. 5A-5B to illustrate analogous elements in the device 500. Therefore, in the interests of brevity, descriptions provided with respect to FIGS. 4A and 4B are not repeated for the device 500, and the description of the device 500 focuses instead on the differences from the device 400.

Similar to the device 400, the device 500 may be an example of the IC device 100, shown in FIG. 1, or may be an example of the memory array 190 of the IC device 100, having multiple memory layers. In particular, each memory layer of the device 500 implements an 8T SRAM cell, labeled in FIG. 5B as an SRAM cell 500-1 in the first memory layer, an SRAM cell 500-2 in the second memory layer, an SRAM cell 500-3 in the third memory layer, and an SRAM cell 500-4 in the fourth memory layer. Two different views are shown in FIGS. 5A-5B in an attempt to bring clarity of the arrangement of the device 500, where different elements may be labeled in different views.

Each of the SRAM cells 500-1 through 500-4 shown in FIG. 5B is an 8T memory cell that includes six transistors M1-M6 as described above with reference to the SRAM cells 300-1 through 300-4, and further includes additional transistors M7 and M8. In the illustration of FIG. 5A, everything below the dashed-dotted line 502 is substantially the same as the illustration of FIG. 4A, and above the line 502 the additional transistors M7 and M8 are shown. As shown in FIG. 5A, the additional transistors M7 and M8 may be implemented along a third nanoribbon 204-3. In some embodiments, the first S/D region 214-1 of the transistor M7 may be coupled to the first S/D region 214-1 of the transistor M8. In some embodiments, the first S/D regions 214-1 of the transistors M7 and M8 may be implemented as a single, shared, S/D region, as is shown in FIG. 5A. The second S/D region 214-2 of the transistor M7 and the second S/D region 214-2 of the transistor M8 may be coupled to ground or VDD.

As also shown in FIG. 5A, in some embodiments, the gate stack 206 of the transistor M7 may be coupled to the first interconnect 426-1, thereby providing coupling between the gate stack 206 of the transistor M7 and each of the shared gate stack 422-1 of the first inverter 320-1 and the shared interconnect 424-2 of the second inverter 320-2. In other words, the gate stack 206 of the transistor M7 may be coupled the input 322-1 of the first inverter 320-1 and the output 324-2 of the second inverter 320-2 of the 6T arrangement of FIG. 3.

As also shown in FIG. 5A, in some embodiments, the gate stack 206 of the transistor M8 may be coupled, via a gate contact 506, to a WL.

FIG. 5B provides a 3D perspective drawing similar to that shown in FIG. 4B. The third nanoribbon 204-3 is only visible for the fourth memory layer shown in FIG. 5B, therefore the third nanoribbon is labeled in FIG. 5B as the nanoribbon 204-43. In some embodiments of the device 500, transistors implemented in the third nanoribbon 204-3, e.g., the transistors M7 and M8, may be of the same type as the transistors implemented in the first nanoribbon 204-1, e.g., NMOS transistors.

Variations and Implementations

Various device assemblies illustrated in FIGS. 1-5 do not represent an exhaustive set of IC devices with 3D nanoribbon-based SRAM as described herein, but merely provide examples of such devices/structures/assemblies. For example, as described above, while some transistors are described above as being NMOS transistors (e.g., transistors M1, M3, M5, and M6) and other transistors are described above as being PMOS transistors (e.g., transistors M2 and M4), all of the descriptions provided above are equally applicable to the embodiments of 3D SRAM devices where this designation is interchanged (i.e., the transistors M1, M3, M5, and M6 could be PMOS, and the transistors M2 and M4 could be NMOS transistors), provided that the designation of the ground potential 322 and the supply voltage 324 would also be interchanged. In another example, in some embodiments, logic devices, e.g., implemented as/using the transistors 200 or implemented as/using transistors of any other architecture, may be included in any of the IC devices shown in FIGS. 1-5, either in the same or separate metal layers from those in which the memory cells are shown. The number and positions of various elements shown in FIGS. 1-5 is purely illustrative and, in various other embodiments, other numbers of these elements, provided in other locations relative to one another may be used in accordance with the general architecture considerations described herein.

Further, FIGS. 1-5 are intended to show relative arrangements of the elements therein, and the device assemblies of these figures may include other elements that are not specifically illustrated (e.g., various interfacial layers). Similarly, although particular arrangements of materials are discussed with reference to FIGS. 1-5, intermediate materials may be included in the IC devices and assemblies of these figures. Still further, although some elements of the various cross-sectional views are illustrated in FIGS. 1-5 as being planar rectangles or formed of rectangular solids, this is simply for ease of illustration, and embodiments of these assemblies may be curved, rounded, or otherwise irregularly shaped as dictated by, and sometimes inevitable due to, the manufacturing processes used to fabricate semiconductor device assemblies.

Inspection of layout and mask data and reverse engineering of parts of a device to reconstruct the circuit using e.g., optical microscopy, TEM, or SEM, and/or inspection of a cross-section of a device to detect the shape and the location of various device elements described herein using e.g., Physical Failure Analysis (PFA) would allow determination of presence of the 3D nanoribbon-based SRAM devices as described herein.

Example Electronic Devices

Arrangements with one or more 3D nanoribbon-based SRAM devices as disclosed herein may be included in any suitable electronic device. FIGS. 6-9 illustrate various examples of devices and components that may include one or more three-dimensional memory arrays as disclosed herein.

Figures 6A, 6B:
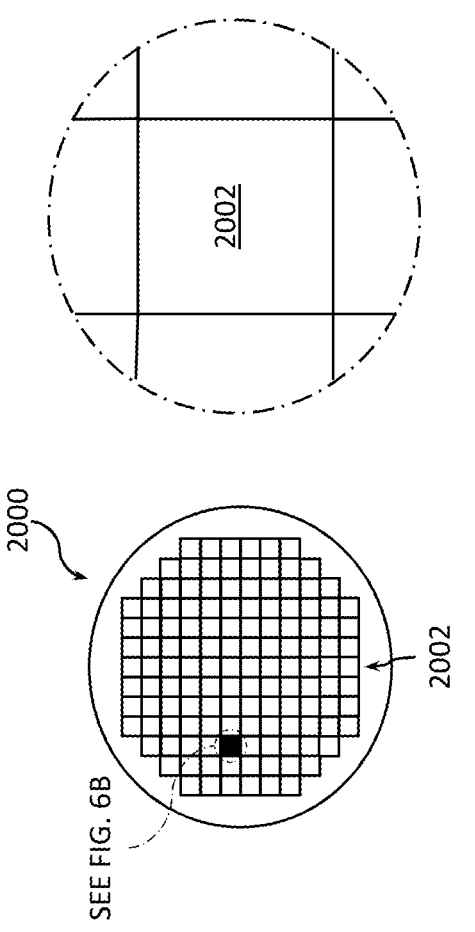
FIGS. 6A and 6B are top views of, respectively, a wafer and dies that may include one or more 3D nanoribbon-based SRAM devices in accordance with any of the embodiments disclosed herein.

FIGS. 6A-6B are top views of a wafer 2000 and dies 2002 that may include one or more 3D nanoribbon-based SRAM devices in accordance with any of the embodiments disclosed herein. In some embodiments, the dies 2002 may be included in an IC package, in accordance with any of the embodiments disclosed herein. For example, any of the dies 2002 may serve as any of the dies 2256 in an IC package 2200 shown in FIG. 7. The wafer 2000 may be composed of semiconductor material and may include one or more dies 2002 having IC structures formed on a surface of the wafer 2000. Each of the dies 2002 may be a repeating unit of a semiconductor product that includes any suitable IC (e.g., ICs including one or more memory arrays with 3D nanoribbon-based SRAM devices as described herein). After the fabrication of the semiconductor product is complete (e.g., after manufacture of one or more layers of the nanoribbon-based SRAM cells as described herein (e.g. any embodiment of the memory array 190 of the IC device 100, e.g. including an array of any of the memory cells described herein), the wafer 2000 may undergo a singulation process in which each of the dies 2002 is separated from one another to provide discrete "chips" of the semiconductor product. In particular, devices that include one or more 3D nanoribbon-based SRAM devices as disclosed herein may take the form of the wafer 2000 (e.g., not singulated) or the form of the die 2002 (e.g., singulated). The die 2002 may include supporting circuitry to route electrical signals to various memory cells, transistors, capacitors, as well as any other IC components. In some embodiments, the wafer 2000 or the die 2002 may implement or include a memory device (e.g., an SRAM device), a logic device (e.g., an AND, OR, NAND, or NOR gate), or any other suitable circuit element. Multiple ones of these devices may be combined on a single die 2002. For example, a memory array formed by multiple memory devices may be formed on a same die 2002 as a processing device (e.g., the processing device 2402 of FIG. 9) or other logic that is configured to store information in the memory devices or execute instructions stored in the memory array.

Figure 7:
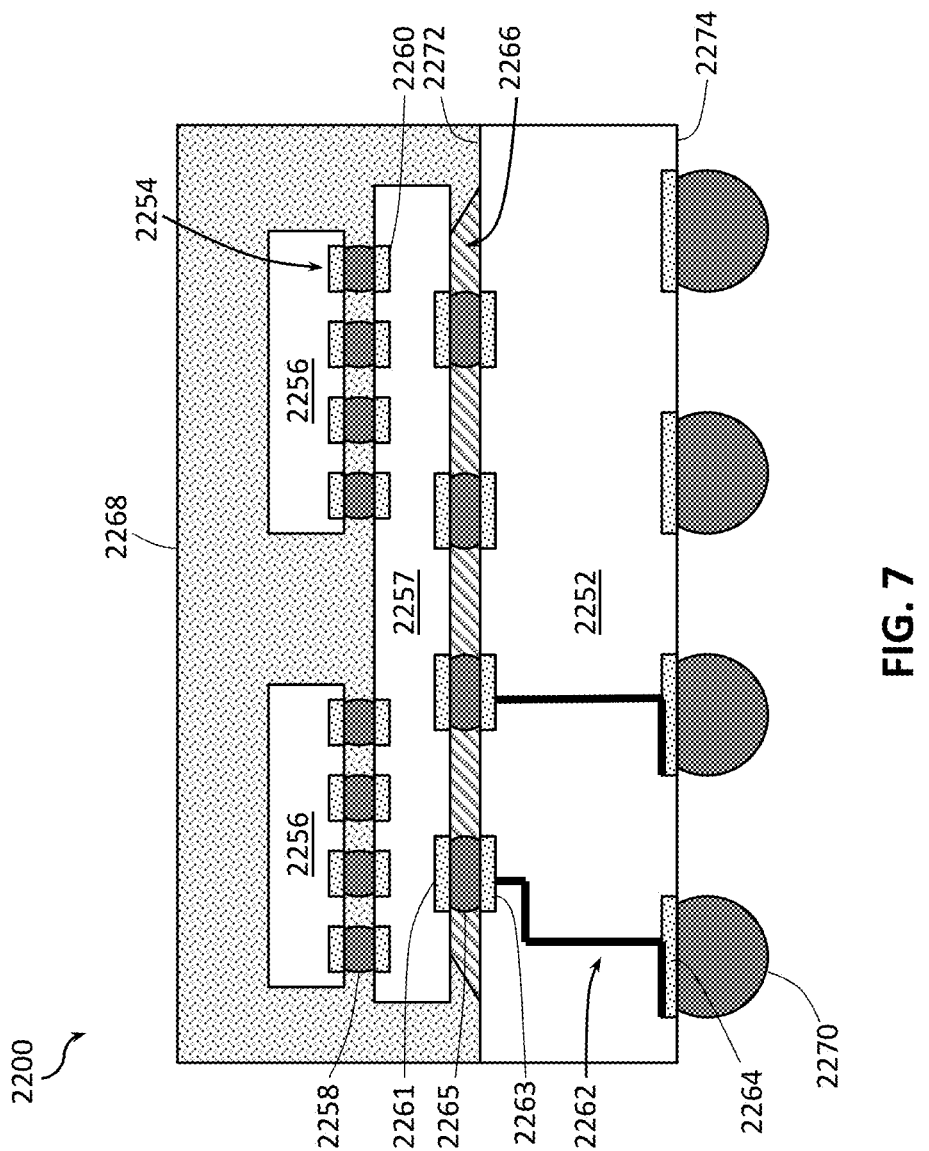
FIG. 7 is a cross-sectional side view of an IC package that may include one or more 3D nanoribbon-based SRAM devices in accordance with any of the embodiments disclosed herein.

FIG. 7 is a side, cross-sectional view of an example IC package 2200 that may include one or more 3D nanoribbon-based SRAM devices in accordance with any of the embodiments disclosed herein. In some embodiments, the IC package 2200 may be a system-in-package (SiP).

The package substrate 2252 may be formed of a dielectric material (e.g., a ceramic, a buildup film, an epoxy film having filler particles therein, etc.), and may have conductive pathways extending through the dielectric material between the face 2272 and the face 2274, or between different locations on the face 2272, and/or between different locations on the face 2274.

The package substrate 2252 may include conductive contacts 2263 that are coupled to conductive pathways 2262 through the package substrate 2252, allowing circuitry within the dies 2256 and/or the interposer 2257 to electrically couple to various ones of the conductive contacts 2264 (or to other devices included in the package substrate 2252, not shown).

The IC package 2200 may include an interposer 2257 coupled to the package substrate 2252 via conductive contacts 2261 of the interposer 2257, first-level interconnects 2265, and the conductive contacts 2263 of the package substrate 2252. The first-level interconnects 2265 illustrated in FIG. 7 are solder bumps, but any suitable first-level interconnects 2265 may be used. In some embodiments, no interposer 2257 may be included in the IC package 2200; instead, the dies 2256 may be coupled directly to the conductive contacts 2263 at the face 2272 by first-level interconnects 2265.

The IC package 2200 may include one or more dies 2256 coupled to the interposer 2257 via conductive contacts 2254 of the dies 2256, first-level interconnects 2258, and conductive contacts 2260 of the interposer 2257. The conductive contacts 2260 may be coupled to conductive pathways (not shown) through the interposer 2257, allowing circuitry within the dies 2256 to electrically couple to various ones of the conductive contacts 2261 (or to other devices included in the interposer 2257, not shown). The first-level interconnects 2258 illustrated in FIG. 7 are solder bumps, but any suitable first-level interconnects 2258 may be used. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, an underfill material 2266 may be disposed between the package substrate 2252 and the interposer 2257 around the first-level interconnects 2265, and a mold compound 2268 may be disposed around the dies 2256 and the interposer 2257 and in contact with the package substrate 2252. In some embodiments, the underfill material 2266 may be the same as the mold compound 2268. Example materials that may be used for the underfill material 2266 and the mold compound 2268 are epoxy mold materials, as suitable. Second-level interconnects 2270 may be coupled to the conductive contacts 2264. The second-level interconnects 2270 illustrated in FIG. 7 are solder balls (e.g., for a ball grid array arrangement), but any suitable second-level interconnects 22770 may be used (e.g., pins in a pin grid array arrangement or lands in a land grid array arrangement). The second-level interconnects 2270 may be used to couple the IC package 2200 to another component, such as a circuit board (e.g., a motherboard), an interposer, or another IC package, as known in the art and as discussed below with reference to FIG. 8.

The dies 2256 may take the form of any of the embodiments of the die 2002 discussed herein (e.g., may include any of the embodiments of the 3D nanoribbon-based SRAM devices as described herein). In embodiments in which the IC package 2200 includes multiple dies 2256, the IC package 2200 may be referred to as a multi-chip package (MCP). The dies 2256 may include circuitry to perform any desired functionality. For example, one or more of the dies 2256 may be logic dies (e.g., silicon-based dies), and one or more of the dies 2256 may be memory dies (e.g., high bandwidth memory), including embedded memory dies as described herein. In some embodiments, any of the dies 2256 may include one or more 3D nanoribbon-based SRAM devices, e.g., as discussed above; in some embodiments, at least some of the dies 2256 may not include any 3D nanoribbon-based SRAM devices.

The IC package 2200 illustrated in FIG. 7 may be a flip chip package, although other package architectures may be used. For example, the IC package 2200 may be a ball grid array (BGA) package, such as an embedded wafer-level ball grid array (eWLB) package. In another example, the IC package 2200 may be a wafer-level chip scale package (WLCSP) or a panel fan-out (FO) package. Although two dies 2256 are illustrated in the IC package 2200 of FIG. 7, an IC package 2200 may include any desired number of the dies 2256. An IC package 2200 may include additional passive components, such as surface-mount resistors, capacitors, and inductors disposed on the first face 2272 or the second face 2274 of the package substrate 2252, or on either face of the interposer 2257. More generally, an IC package 2200 may include any other active or passive components known in the art.

Figure 8:
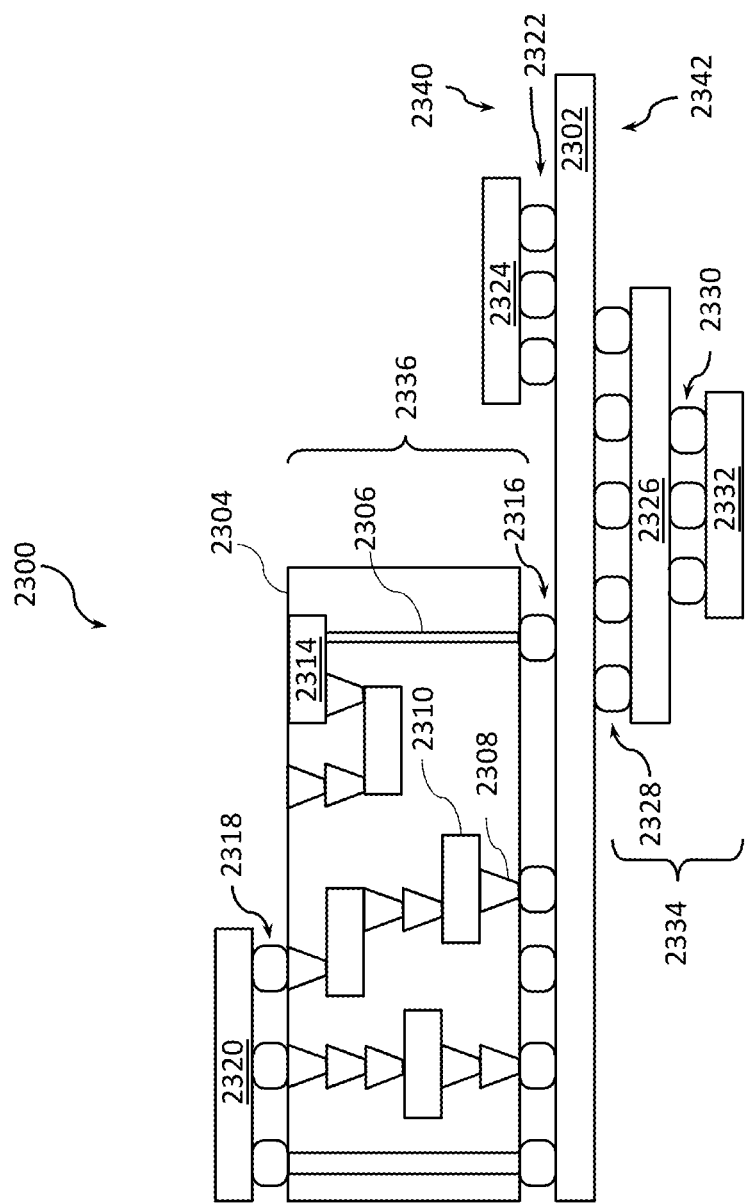
FIG. 8 is a cross-sectional side view of an IC device assembly that may include one or more 3D nanoribbon-based SRAM devices in accordance with any of the embodiments disclosed herein.

FIG. 8 is a cross-sectional side view of an IC device assembly 2300 that may include components having one or more 3D nanoribbon-based SRAM devices in accordance with any of the embodiments disclosed herein. The IC device assembly 2300 includes a number of components disposed on a circuit board 2302 (which may be, e.g., a motherboard). The IC device assembly 2300 includes components disposed on a first face 2340 of the circuit board 2302 and an opposing second face 2342 of the circuit board 2302; generally, components may be disposed on one or both faces 2340 and 2342. In particular, any suitable ones of the components of the IC device assembly 2300 may include any of one or more 3D memory arrays with nanoribbon-based SRAM cells in accordance with any of the embodiments disclosed herein; e.g., any of the IC packages discussed below with reference to the IC device assembly 2300 may take the form of any of the embodiments of the IC package 2200 discussed above with reference to FIG. 7 (e.g., may include one or more 3D nanoribbon-based SRAM devices provided on a die 2256).

In some embodiments, the circuit board 2302 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2302. In other embodiments, the circuit board 2302 may be a non-PCB substrate.

The IC device assembly 2300 illustrated in FIG. 8 includes a package-on-interposer structure 2336 coupled to the first face 2340 of the circuit board 2302 by coupling components 2316. The coupling components 2316 may electrically and mechanically couple the package-on-interposer structure 2336 to the circuit board 2302, and may include solder balls (e.g., as shown in FIG. 8), male and female portions of a socket, an adhesive, an underfill material, and/or any other suitable electrical and/or mechanical coupling structure.

The package-on-interposer structure 2336 may include an IC package 2320 coupled to an interposer 2304 by coupling components 2318. The coupling components 2318 may take any suitable form for the application, such as the forms discussed above with reference to the coupling components 2316. The IC package 2320 may be or include, for example, a die (the die 2002 of FIG. 6B), an IC device, or any other suitable component. In particular, the IC package 2320 may include one or more 3D nanoribbon-based SRAM devices as described herein. Although a single IC package 2320 is shown in FIG. 8, multiple IC packages may be coupled to the interposer 2304; indeed, additional interposers may be coupled to the interposer 2304. The interposer 2304 may provide an intervening substrate used to bridge the circuit board 2302 and the IC package 2320. Generally, the interposer 2304 may spread a connection to a wider pitch or reroute a connection to a different connection. For example, the interposer 2304 may couple the IC package 2320 (e.g., a die) to a BGA of the coupling components 2316 for coupling to the circuit board 2302. In the embodiment illustrated in FIG. 8, the IC package 2320 and the circuit board 2302 are attached to opposing sides of the interposer 2304; in other embodiments, the IC package 2320 and the circuit board 2302 may be attached to a same side of the interposer 2304. In some embodiments, three or more components may be interconnected by way of the interposer 2304.

The interposer 2304 may be formed of an epoxy resin, a fiberglass-reinforced epoxy resin, a ceramic material, or a polymer material such as polyimide. In some implementations, the interposer 2304 may be formed of alternate rigid or flexible materials that may include the same materials described above for use in a semiconductor substrate, such as silicon, germanium, and other group III-V and group IV materials. The interposer 2304 may include metal interconnects 2308 and vias 2310, including but not limited to through-silicon vias (TSVs) 2306. The interposer 2304 may further include embedded devices 2314, including both passive and active devices. Such devices may include, but are not limited to, capacitors, decoupling capacitors, resistors, inductors, fuses, diodes, transformers, sensors, electrostatic discharge (ESD) protection devices, and memory devices. More complex devices such as radio frequency (RF) devices, power amplifiers, power management devices, antennas, arrays, sensors, and microelectromechanical systems (MEMS) devices may also be formed on the interposer 2304. The package-on-interposer structure 2336 may take the form of any of the package-on-interposer structures known in the art.

The IC device assembly 2300 may include an IC package 2324 coupled to the first face 2340 of the circuit board 2302 by coupling components 2322. The coupling components 2322 may take the form of any of the embodiments discussed above with reference to the coupling components 2316, and the IC package 2324 may take the form of any of the embodiments discussed above with reference to the IC package 2320.

The IC device assembly 2300 illustrated in FIG. 8 includes a package-on-package structure 2334 coupled to the second face 2342 of the circuit board 2302 by coupling components 2328. The package-on-package structure 2334 may include an IC package 2326 and an IC package 2332 coupled together by coupling components 2330 such that the IC package 2326 is disposed between the circuit board 2302 and the IC package 2332. The coupling components 2328 and 2330 may take the form of any of the embodiments of the coupling components 2316 discussed above, and the IC packages 2326 and 2332 may take the form of any of the embodiments of the IC package 2320 discussed above. The package-on-package structure 2334 may be configured in accordance with any of the package-on-package structures known in the art.

Figure 9:
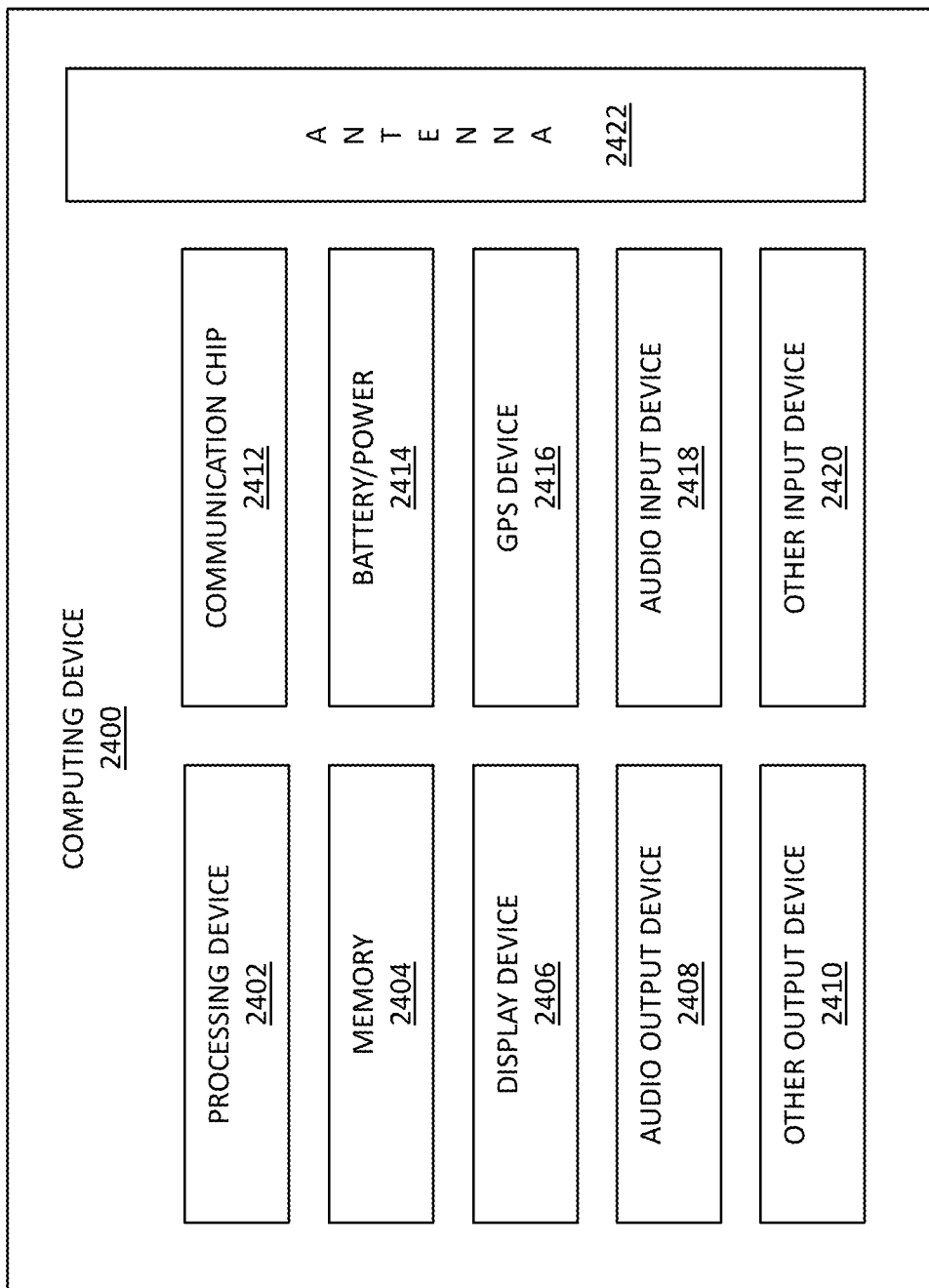
FIG. 9 is a block diagram of an example computing device that may include one or more 3D nanoribbon-based SRAM devices in accordance with any of the embodiments disclosed herein.

FIG. 9 is a block diagram of an example computing device 2400 that may include one or more components with one or more 3D nanoribbon-based SRAM devices in accordance with any of the embodiments disclosed herein. For example, any suitable ones of the components of the computing device 2400 may include a die (e.g., the die 2002 (FIG. 6B)) including one or more 3D arrays of nanoribbon-based SRAM cells in accordance with any of the embodiments disclosed herein. Any of the components of the computing device 2400 may include an IC package 2200 (FIG. 7). Any of the components of the computing device 2400 may include an IC device assembly 2300 (FIG. 8).

A number of components are illustrated in FIG. 9 as included in the computing device 2400, but any one or more of these components may be omitted or duplicated, as suitable for the application. In some embodiments, some or all of the components included in the computing device 2400 may be attached to one or more motherboards. In some embodiments, some or all of these components are fabricated onto a single SoC die.

Additionally, in various embodiments, the computing device 2400 may not include one or more of the components illustrated in FIG. 9, but the computing device 2400 may include interface circuitry for coupling to the one or more components. For example, the computing device 2400 may not include a display device 2406, but may include display device interface circuitry (e.g., a connector and driver circuitry) to which a display device 2406 may be coupled. In another set of examples, the computing device 2400 may not include an audio input device 2418 or an audio output device 2408, but may include audio input or output device interface circuitry (e.g., connectors and supporting circuitry) to which an audio input device 2418 or audio output device 2408 may be coupled.

The computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2402 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 2400 may include a memory 2404, which may itself include one or more memory devices such as volatile memory (e.g., DRAM), nonvolatile memory (e.g., read-only memory (ROM)), flash memory, solid state memory, and/or a hard drive. In some embodiments, the memory 2404 may include memory that shares a die with the processing device 2402. This memory may be used as cache memory and may include eSRAM, e.g. a 3D array of nanoribbon-based SRAM cells as described herein.

In some embodiments, the computing device 2400 may include a communication chip 2412 (e.g., one or more communication chips). For example, the communication chip 2412 may be configured for managing wireless communications for the transfer of data to and from the computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2412 may operate in accordance with other wireless protocols in other embodiments. The computing device 2400 may include an antenna 2422 to facilitate wireless communications and/or to receive other wireless communications (such as AM or FM radio transmissions).

In some embodiments, the communication chip 2412 may manage wired communications, such as electrical, optical, or any other suitable communication protocols (e.g., the Ethernet). As noted above, the communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

The computing device 2400 may include battery/power circuitry 2414. The battery/power circuitry 2414 may include one or more energy storage devices (e.g., batteries or capacitors) and/or circuitry for coupling components of the computing device 2400 to an energy source separate from the computing device 2400 (e.g., AC line power).

The computing device 2400 may include a display device 2406 (or corresponding interface circuitry, as discussed above). The display device 2406 may include any visual indicators, such as a heads-up display, a computer monitor, a projector, a touchscreen display, a liquid crystal display (LCD), a light-emitting diode display, or a flat panel display, for example.

The computing device 2400 may include an audio output device 2408 (or corresponding interface circuitry, as discussed above). The audio output device 2408 may include any device that generates an audible indicator, such as speakers, headsets, or earbuds, for example.

The computing device 2400 may include an audio input device 2418 (or corresponding interface circuitry, as discussed above). The audio input device 2418 may include any device that generates a signal representative of a sound, such as microphones, microphone arrays, or digital instruments (e.g., instruments having a musical instrument digital interface (MIDI) output).

The computing device 2400 may include a GPS device 2416 (or corresponding interface circuitry, as discussed above). The GPS device 2416 may be in communication with a satellite-based system and may receive a location of the computing device 2400, as known in the art.

The computing device 2400 may include an other output device 2410 (or corresponding interface circuitry, as discussed above). Examples of the other output device 2410 may include an audio codec, a video codec, a printer, a wired or wireless transmitter for providing information to other devices, or an additional storage device.

The computing device 2400 may include an other input device 2420 (or corresponding interface circuitry, as discussed above). Examples of the other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2400 may be any other electronic device that processes data.

Select Examples

The following paragraphs provide various examples of the embodiments disclosed herein.

Example 1 provides an SRAM device (or, more generally, an IC device) that includes a support structure (e.g., a substrate, a chip, or a wafer); a first semiconductor nanoribbon, extending in a direction substantially parallel to the support structure (where, in general, the term "nanoribbon" refers to an elongated semiconductor structure such as a nanoribbon or a nanowire, having a long axis parallel to the support structure); a second semiconductor nanoribbon, extending in a direction substantially parallel to the support structure and provided in substantially the same plane as the first nanoribbon. The SRAM device further includes a transistor M1 and a transistor M3, each including a first source or drain (S/D) region and a second S/D region in the first nanoribbon; and a transistor M2 and a transistor M4, each including a first S/D region and a second S/D region in the second nanoribbon, where the first S/D region of the transistor M1 is coupled to the first S/D region of the transistor M2, and a gate stack of the transistor M1 is coupled to a gate stack of the transistor M2 (thus, transistors M1 and M2 form an inverter), and the first S/D region of the transistor M3 is coupled to the first S/D region of the transistor M4, and a gate stack of the transistor M3 is coupled to a gate stack of the transistor M4 (thus, transistors M3 and M4 form a second inverter).

Example 2 provides the SRAM device according to example 1, where the first nanoribbon includes a semiconductor material of a first type, the second nanoribbon includes a semiconductor material of a second type, one of the first type and the second type is an N-type semiconductor material and another one of the first type and the second type is a P-type semiconductor material.

Example 3 provides the SRAM device according to examples 1 or 2, where each of the first S/D region of the transistor M1 and the first S/D region of the transistor M2 is coupled to a first bitline, each of the gate stack of the transistor M1 and the gate stack of the transistor M2 is coupled to a second bitline, each of the first S/D region of the transistor M3 and the first S/D region of the transistor M4 is coupled to the second bitline, each of the gate stack of the transistor M3 and the gate stack of the transistor M4 is coupled to the first bitline, and during operation of the SRAM device, a signal on the first bitline is complementary to a signal on the second bitline.

Example 4 provides the SRAM device according to example 3, where each of the first and second nanoribbons extends in a direction substantially parallel to a support structure over which the SRAM device is provided, and each of the first bitline and the second bitline extends in a direction substantially perpendicular to the support structure.

Example 5 provides the SRAM device according to examples 3 or 4, where the SRAM device further includes a transistor M5 and a transistor M6, each including the first S/D region and the second S/D region in the first nanoribbon, each of the first S/D region of the transistor M1 and the first S/D region of the transistor M2 is coupled to the first bitline by being coupled to the first S/D region of the transistor M5 and the second S/D region of the transistor M5 being coupled to the first bitline, each of the gate stack of the transistor M1 and the gate stack of the transistor M2 is coupled to the second bitline by being coupled to the first S/D region of the transistor M6 and the second S/D region of the transistor M6 being coupled to the second bitline, each of the first S/D region of the transistor M3 and the first S/D region of the transistor M4 is coupled to the second bitline by being coupled to the first S/D region of the transistor M6 and the second S/D region of the transistor M6 being coupled to the second bitline, each of the gate stack of the transistor M3 and the gate stack of the transistor M4 is coupled to the first bitline by being coupled to the first S/D region of the transistor M5 and the second S/D region of the transistor M5 being coupled to the first bitline.

Example 6 provides the SRAM device according to example 5, where a gate stack of each of the transistor M5 and the transistor M6 is coupled to a wordline.

Example 7 provides the SRAM device according to example 6, where the transistors M1-M6 of the first and second nanoribbons form a first SRAM cell in a first plane above a support structure over which the SRAM device is provided, and where the SRAM device further includes a third semiconductor nanoribbon, extending in a direction substantially parallel to the support structure and provided in a plane different from that of the first and second nanoribbons, a fourth semiconductor nanoribbon, extending in a direction substantially parallel to the support structure and provided in substantially the same plane as the third nanoribbon, transistors M1, M3, M5, and M6, each including a first S/D region and a second S/D region in the third nanoribbon, and transistors M2 and M4, each including a first S/D region and a second S/D region in the fourth nanoribbon. In such an SRAM device, the transistors M1-M6 of the third and fourth nanoribbons form a second SRAM cell in a second plane above the support structure, where the second plane is between the first plane and the support structure, and a contact to the gate stack of the transistor M5 of the first SRAM cell and a contact to a gate stack of the transistor M5 of the second SRAM cell are formed in a staircase manner.

Example 8 provides the SRAM device according to example 7, where a contact to the gate stack of the transistor M6 of the first SRAM cell and a contact to a gate stack of the transistor M6 of the second SRAM cell are formed in the staircase manner.

Example 9 provides the SRAM device according to any one of examples 5-8, where the SRAM device further includes a third semiconductor nanoribbon, extending in a direction substantially parallel to the support structure and provided in substantially the same plane as the first and second nanoribbons, the SRAM device further includes a transistor M7 and a transistor M8, each including the first S/D region and the second S/D region in the third nanoribbon, the gate stack of the transistor M1 is further coupled to a gate stack of the transistor M7, and the first S/D region of the transistor M7 is coupled to the first S/D region of the transistor M8.

Example 10 provides the SRAM device according to example 9, where each of the first nanoribbon and the third nanoribbon includes a semiconductor material of a first type, the second nanoribbon includes a semiconductor material of a second type, one of the first type and the second type is an N-type semiconductor material and another one of the first type and the second type is a P-type semiconductor material.

Example 11 provides an SRAM device (or, more generally, an IC device) that includes a support structure (e.g., a substrate, a chip, or a wafer); a first nanoribbon, extending in a direction substantially parallel to the support structure; a second semiconductor nanoribbon, extending in a direction substantially parallel to the support structure and provided in substantially the same plane as the first nanoribbon; and an SRAM cell, including a first inverter structure and a second inverter structure, where the first inverter structure includes a transistor M1 in the first nanoribbon and a transistor M2 in the second nanoribbon, and the second inverter structure includes a transistor M3 in the first nanoribbon and a transistor M4 in the second nanoribbon.

Example 12 provides the SRAM device according to example 11, where the first nanoribbon includes a semiconductor material of a first type, the second nanoribbon includes a semiconductor material of a second type, one of the first type and the second type is an N-type semiconductor material and another one of the first type and the second type is a P-type semiconductor material.

Example 13 provides the SRAM device according to examples 11 or 12, where an output of the first inverter structure is coupled to a first bitline, an input of the first inverter structure is coupled to a second bitline, an output of the second inverter structure is coupled to the second bitline, an input of the second inverter structure is coupled to the first bitline, and during operation of the SRAM device, a signal on the first bitline is complementary to a signal on the second bitline.

Example 14 provides the SRAM device according to example 13, where the SRAM device further includes a first access transistor (transistor M5) and a second access transistor (transistor M6), the output of the first inverter structure is coupled to the first bitline by being coupled to the first access transistor and the first access transistor being coupled to the first bitline, the input of the first inverter structure is coupled to the second bitline by being coupled to the second access transistor and the second access transistor being coupled to the second bitline, the output of the second inverter structure is coupled to the second bitline by being coupled to the second access transistor and the second access transistor being coupled to the second bitline, and the input of the second inverter structure is coupled to the first bitline by being coupled to the first access transistor and the first access transistor being coupled to the first bitline.

Example 15 provides the SRAM device according to example 13, where each of the transistors M1-M4 includes a first source or drain (S/D) region, a second S/D region, and a gate stack; the first bitline is coupled to each of the first S/D region of the transistor M1 and the first S/D region of the transistor M2; the second bitline is coupled to each of the gate stack of the transistor M1 and the gate stack of the transistor M2; the second bitline is coupled to each of the first S/D region of the transistor M3 and the first S/D region of the transistor M4; and the first bitline is coupled to each of the gate stack of the transistor M3 and the gate stack of the transistor M4.

Example 16 provides the SRAM device according to example 15, where the SRAM device further includes a transistor M5 and a transistor M6, each including the first S/D region and the second S/D region in the first nanoribbon, each of the first S/D region of the transistor M1 and the first S/D region of the transistor M2 is coupled to the first bitline by being coupled to the first S/D region of the transistor M5 and the second S/D region of the transistor M5 being coupled to the first bitline, each of the gate stack of the transistor M1 and the gate stack of the transistor M2 is coupled to the second bitline by being coupled to the first S/D region of the transistor M6 and the second S/D region of the transistor M6 being coupled to the second bitline, each of the first S/D region of the transistor M3 and the first S/D region of the transistor M4 is coupled to the second bitline by being coupled to the first S/D region of the transistor M6 and the second S/D region of the transistor M6 being coupled to the second bitline, and each of the gate stack of the transistor M3 and the gate stack of the transistor M4 is coupled to the first bitline by being coupled to the first S/D region of the transistor M5 and the second S/D region of the transistor M5 being coupled to the first bitline.

Example 17 provides the SRAM device according to example 16, where a gate stack of each of the transistor M5 and the transistor M6 is coupled to a wordline.

Example 18 provides a method of fabricating an SRAM device (or, more generally, an IC device). The method includes providing a first semiconductor nanoribbon, extending in a direction substantially parallel to the support structure; providing a second semiconductor nanoribbon, extending in a direction substantially parallel to the support structure and provided in substantially the same plane as the first nanoribbon; providing a transistor M1 and a transistor M3, each including a first source or drain (S/D) region and a second S/D region in the first nanoribbon; and providing a transistor M2 and a transistor M4, each including a first S/D region and a second S/D region in the second nanoribbon, where the first S/D region of the transistor M1 is coupled to the first S/D region of the transistor M2, and a gate stack of the transistor M1 is coupled to a gate stack of the transistor M2 (thus, transistors M1 and M2 form an inverter), and the first S/D region of the transistor M3 is coupled to the first S/D region of the transistor M4, and a gate stack of the transistor M3 is coupled to a gate stack of the transistor M4 (thus, transistors M3 and M4 form a second inverter).

Example 19 provides the method according to example 18, where the first nanoribbon includes a semiconductor material of a first type, the second nanoribbon includes a semiconductor material of a second type, one of the first type and the second type is an N-type semiconductor material and another one of the first type and the second type is a P-type semiconductor material.

Example 20 provides the method according to examples 18 or 19, further including providing a first bitline and a second bitline, where each of the first S/D region of the transistor M1 and the first S/D region of the transistor M2 is coupled to the first bitline, each of the gate stack of the transistor M1 and the gate stack of the transistor M2 is coupled to the second bitline, each of the first S/D region of the transistor M3 and the first S/D region of the transistor M4 is coupled to the second bitline, each of the gate stack of the transistor M3 and the gate stack of the transistor M4 is coupled to the first bitline, and during operation of the SRAM device, a signal on the first bitline is complementary to a signal on the second bitline.

Example 21 provides an IC package that includes an IC die, including one or more of the memory/IC devices according to any one of the preceding examples. The IC package may also include a further component, coupled to the IC die.

Example 22 provides the IC package according to example 21, where the further component is one of a package substrate, a flexible substrate, or an interposer.

Example 23 provides the IC package according to examples 21 or 22, where the further component is coupled to the IC die via one or more first level interconnects.

Example 24 provides the IC package according to example 23, where the one or more first level interconnects include one or more solder bumps, solder posts, or bond wires.

Example 25 provides a computing device that includes a circuit board; and an IC die coupled to the circuit board, where the IC die includes one or more of the memory/IC devices according to any one of the preceding examples (e.g., memory/IC devices according to any one of examples 1-17), and/or the IC die is included in the IC package according to any one of the preceding examples (e.g., the IC package according to any one of examples 21-24).

Example 26 provides the computing device according to example 25, where the computing device is a wearable computing device (e.g., a smart watch) or handheld computing device (e.g., a mobile phone).

Example 27 provides the computing device according to examples 25 or 26, where the computing device is a server processor.

Example 28 provides the computing device according to examples 25 or 26, where the computing device is a motherboard.

Example 29 provides the computing device according to any one of examples 25-28, where the computing device further includes one or more communication chips and an antenna.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. A memory device, comprising:
a first nanoribbon;
a second nanoribbon;
a transistor M1 and a transistor M3, each comprising a first source or drain (S/D) region and a second S/D region in the first nanoribbon; and
a transistor M2 and a transistor M4, each comprising a first S/D region and a second S/D region in the second nanoribbon,
wherein:
the first S/D region of the transistor M1 is coupled to the first S/D region of the transistor M2, and a gate stack of the transistor M1 is coupled to a gate stack of the transistor M2, and
the first S/D region of the transistor M3 is coupled to the first S/D region of the transistor M4, and a gate stack of the transistor M3 is coupled to a gate stack of the transistor M4.

2. The memory device according to claim 1, wherein the first nanoribbon includes a semiconductor material of a first type, the second nanoribbon includes a semiconductor material of a second type, one of the first type and the second type is an N-type semiconductor material and another one of the first type and the second type is a P-type semiconductor material.

3. The memory device according to claim 1, wherein:
each of the first S/D region of the transistor M1 and the first S/D region of the transistor M2 is coupled to a first bitline,
each of the gate stack of the transistor M1 and the gate stack of the transistor M2 is coupled to a second bitline,
each of the first S/D region of the transistor M3 and the first S/D region of the transistor M4 is coupled to the second bitline,
each of the gate stack of the transistor M3 and the gate stack of the transistor M4 is coupled to the first bitline, and
during operation of the memory device, a signal on the first bitline is complementary to a signal on the second bitline.

4. The memory device according to claim 3, wherein:
each of the first and second nanoribbons extends in a direction substantially parallel to a support structure over which the memory device is provided, and
each of the first bitline and the second bitline extends in a direction substantially perpendicular to the support structure.

5. The memory device according to claim 3, wherein:
the memory device further includes a transistor M5 and a transistor M6, each comprising the first S/D region and the second S/D region in the first nanoribbon,
each of the first S/D region of the transistor M1 and the first S/D region of the transistor M2 is coupled to the first bitline by being coupled to the first S/D region of the transistor M5 and the second S/D region of the transistor M5 being coupled to the first bitline, each of the gate stack of the transistor M1 and the gate stack of the transistor M2 is coupled to the second bitline by being coupled to the first S/D region of the transistor M6 and the second S/D region of the transistor M6 being coupled to the second bitline, each of the first S/D region of the transistor M3 and the first S/D region of the transistor M4 is coupled to the second bitline by being coupled to the first S/D region of the transistor M6 and the second S/D region of the transistor M6 being coupled to the second bitline, each of the gate stack of the transistor M3 and the gate stack of the transistor M4 is coupled to the first bitline by being coupled to the first S/D region of the transistor M5 and the second S/D region of the transistor M5 being coupled to the first bitline.

6. The memory device according to claim 5, wherein a gate stack of each of the transistor M5 and the transistor M6 is coupled to a wordline.

7. The memory device according to claim 6, wherein:
the transistors M1-M6 of the first and second nanoribbons form a first memory cell in a first plane above a support structure,
the memory device further includes:
a third nanoribbon,
a fourth nanoribbon,
transistors M1, M3, M5, and M6, each comprising a first S/D region and a second S/D region in the third nanoribbon, and
transistors M2 and M4, each comprising a first S/D region and a second S/D region in the fourth nanoribbon,
the transistors M1-M6 of the third and fourth nanoribbons form a second memory cell in a second plane above the support structure, where the second plane is between the first plane and the support structure, and
a contact to the gate stack of the transistor M5 of the first memory cell and a contact to a gate stack of the transistor M5 of the second memory cell are arranged in a staircase manner.

8. The memory device according to claim 7, wherein a contact to the gate stack of the transistor M6 of the first memory cell and a contact to a gate stack of the transistor M6 of the second memory cell are arranged in the staircase manner.

9. The memory device according to claim 5, wherein:
the memory device further includes a third nanoribbon,
the memory device further includes a transistor M7 and a transistor M8, each comprising the first S/D region and the second S/D region in the third nanoribbon,
the gate stack of the transistor M1 is further coupled to a gate stack of the transistor M7, and
the first S/D region of the transistor M7 is coupled to the first S/D region of the transistor M8.

10. The memory device according to claim 9, wherein each of the first nanoribbon and the third nanoribbon includes a semiconductor material of a first type, the second nanoribbon includes a semiconductor material of a second type, one of the first type and the second type is an N-type semiconductor material and another one of the first type and the second type is a P-type semiconductor material.

11. A memory device, comprising:
a first nanoribbon;
a second nanoribbon; and
an memory cell, comprising a first inverter structure and a second inverter structure,
wherein:

the first inverter structure includes a transistor M1 along the first nanoribbon and a transistor M2 along the second nanoribbon, and
the second inverter structure includes a transistor M3 along the first nanoribbon and a transistor M4 along the second nanoribbon.

12. The memory device according to claim 11, wherein the first nanoribbon includes a semiconductor material of a first type, the second nanoribbon includes a semiconductor material of a second type, one of the first type and the second type is an N-type semiconductor material and another one of the first type and the second type is a P-type semiconductor material.

13. The memory device according to claim 11, wherein:
an output of the first inverter structure is coupled to a first bitline,
an input of the first inverter structure is coupled to a second bitline,
an output of the second inverter structure is coupled to the second bitline,
an input of the second inverter structure is coupled to the first bitline, and
during operation of the memory device, a signal on the first bitline is complementary to a signal on the second bitline.

14. The memory device according to claim 13, wherein:
the memory device further includes a first access transistor and a second access transistor,
the output of the first inverter structure is coupled to the first bitline by being coupled to the first access transistor and the first access transistor being coupled to the first bitline,
the input of the first inverter structure is coupled to the second bitline by being coupled to the second access transistor and the second access transistor being coupled to the second bitline,
the output of the second inverter structure is coupled to the second bitline by being coupled to the second access transistor and the second access transistor being coupled to the second bitline, and
the input of the second inverter structure is coupled to the first bitline by being coupled to the first access transistor and the first access transistor being coupled to the first bitline.

15. The memory device according to claim 13, wherein:
each of the transistors M1-M4 includes a first source or drain (S/D) region, a second S/D region, and a gate stack,
the first bitline is coupled to each of the first S/D region of the transistor M1 and the first S/D region of the transistor M2,
the second bitline is coupled to each of the gate stack of the transistor M1 and the gate stack of the transistor M2,
the second bitline is coupled to each of the first S/D region of the transistor M3 and the first S/D region of the transistor M4, and
the first bitline is coupled to each of the gate stack of the transistor M3 and the gate stack of the transistor M4.

16. The memory device according to claim 15, wherein:
the memory device further includes a transistor M5 and a transistor M6, each comprising the first S/D region and the second S/D region in the first nanoribbon,
each of the first S/D region of the transistor M1 and the first S/D region of the transistor M2 is coupled to the first bitline by being coupled to the first S/D region of the transistor M5 and the second S/D region of the transistor M5 being coupled to the first bitline, each of the gate stack of the transistor M1 and the gate stack of the transistor M2 is coupled to the second bitline by being coupled to the first S/D region of the transistor M6 and the second S/D region of the transistor M6 being coupled to the second bitline, each of the first S/D region of the transistor M3 and the first S/D region of the transistor M4 is coupled to the second bitline by being coupled to the first S/D region of the transistor M6 and the second S/D region of the transistor M6 being coupled to the second bitline, and each of the gate stack of the transistor M3 and the gate stack of the transistor M4 is coupled to the first bitline by being coupled to the first S/D region of the transistor M5 and the second S/D region of the transistor M5 being coupled to the first bitline.

17. The memory device according to claim 16, wherein a gate stack of each of the transistor M5 and the transistor M6 is coupled to a wordline.

18. A method of fabricating a memory device, the method comprising:
providing a first nanoribbon;
providing a second nanoribbon;
providing a transistor M1 and a transistor M3, each comprising a first source or drain (S/D) region and a second S/D region in the first nanoribbon; and
providing a transistor M2 and a transistor M4, each comprising a first S/D region and a second S/D region in the second nanoribbon,
wherein:

the first S/D region of the transistor M1 is coupled to the first S/D region of the transistor M2, and a gate stack of the transistor M1 is coupled to a gate stack of the transistor M2, and the first S/D region of the transistor M3 is coupled to the first S/D region of the transistor M4, and a gate stack of the transistor M3 is coupled to a gate stack of the transistor M4.

19. The method according to claim 18, wherein the first nanoribbon includes a semiconductor material of a first type, the second nanoribbon includes a semiconductor material of a second type, one of the first type and the second type is an N-type semiconductor material and another one of the first type and the second type is a P-type semiconductor material.

20. The method according to claim 18, further comprising providing a first bitline and a second bitline, where:
each of the first S/D region of the transistor M1 and the first S/D region of the transistor M2 is coupled to the first bitline,
each of the gate stack of the transistor M1 and the gate stack of the transistor M2 is coupled to the second bitline,
each of the first S/D region of the transistor M3 and the first S/D region of the transistor M4 is coupled to the second bitline,
each of the gate stack of the transistor M3 and the gate stack of the transistor M4 is coupled to the first bitline, and
during operation of the memory device, a signal on the first bitline is complementary to a signal on the second bitline.

\* \* \* \* \*